(12) United States Patent
Haba et al.

(10) Patent No.:     US 12,564,084 B2
(45) Date of Patent:     Feb. 24, 2026

(54) BONDED STRUCTURES WITHOUT INTERVENING ADHESIVE

(71) Applicant: ADEIA SEMICONDUCTOR BONDING TECHNOLOGIES INC., San Jose, CA (US)

(72) Inventors: Belgacem Haba, Saratoga, CA (US); Rajesh Katkar, Milpitas, CA (US); Ilyas Mohammed, Santa Clara, CA (US); Javier A. DeLaCruz, San Jose, CA (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 440 days.

(21) Appl. No.: 18/462,691

(22) Filed:     Sep. 7, 2023

(65)     Prior Publication Data

US 2023/0420399 A1     Dec. 28, 2023

Related U.S. Application Data

(63) Continuation of application No. 17/563,506, filed on Dec. 28, 2021, now Pat. No. 11,817,409, which is a
(Continued)

(51) Int. Cl.
H01L 23/00     (2006.01)
H01L 21/78     (2006.01)

(52) U.S. Cl.
CPC ............. H01L 24/08 (2013.01); H01L 21/78 (2013.01); H01L 24/80 (2013.01); H01L 24/94 (2013.01);
(Continued)

(58) Field of Classification Search
CPC ......... H01L 21/561; H01L 2224/80895; H01L 2224/08145; H01L 21/56; H01L 2224/96;
(Continued)

(56)     References Cited

U.S. PATENT DOCUMENTS 4,998,665 A     3/1991     Hayashi
5,019,673 A     5/1991     Juskey et al.
(Continued)

FOREIGN PATENT DOCUMENTS

CN     103681646     3/2014
CN     104078414 A     10/2014
(Continued)

OTHER PUBLICATIONS

Amirfeiz et al., "Formation of silicon structures by plasma-activated wafer bonding," Journal of The Electrochemical Society, 2000, vol. 147, No. 7, pp. 2693-2698.
(Continued)

*Primary Examiner* — Didarul A Mazumder
(74) *Attorney, Agent, or Firm* — Knobbe, Martens, Olson & Bear, LLP

(57)     ABSTRACT

A bonded structure can include a first reconstituted element comprising a first element and having a first side comprising a first bonding surface and a second side opposite the first side. The first reconstituted element can comprise a first protective material disposed about a first sidewall surface of the first element. The bonded structure can comprise a second reconstituted element comprising a second element and having a first side comprising a second bonding surface and a second side opposite the first side. The first reconstituted element can comprise a second protective material disposed about a second sidewall surface of the second element. The second bonding surface of the first side of the second reconstituted element can be directly bonded to the first bonding surface of the first side of the first reconstituted element without an intervening adhesive along a bonding interface.

38 Claims, 18 Drawing Sheets

Related U.S. Application Data continuation of application No. 16/741,575, filed on Jan. 13, 2020, now Pat. No. 11,476,213.

(60) Provisional application No. 62/792,360, filed on Jan. 14, 2019.

(52) U.S. Cl.
CPC ............... *H01L 2224/08146* (2013.01); *H01L 2224/80006* (2013.01); *H01L 2224/80895* (2013.01); *H01L 2224/80896* (2013.01)

(58) Field of Classification Search
CPC ......... H01L 2225/1035; H01L 23/3107; H01L 24/96; H01L 2221/68327
USPC .................. 257/782; 438/118, 617, 612, 666
See application file for complete search history.

(56) References Cited

U.S. PATENT DOCUMENTS

| | | | |
|---|---|---|---|
| 5,087,585 A | 2/1992 | Hayashi | |
| 5,322,593 A | 6/1994 | Hasegawa et al. | |
| 5,753,536 A | 5/1998 | Sugiyama et al. | |
| 5,771,555 A | 6/1998 | Eda et al. | |
| 5,956,605 A | 9/1999 | Akram et al. | |
| 5,985,739 A | 11/1999 | Plettner et al. | |
| 5,998,808 A | 12/1999 | Matsushita | |
| 6,008,126 A | 12/1999 | Leedy | |
| 6,049,124 A | 4/2000 | Raiser et al. | |
| 6,080,640 A | 6/2000 | Gardner et al. | |
| 6,121,688 A | 9/2000 | Akagawa | |
| 6,265,775 B1 | 7/2001 | Seyyedy | |
| 6,374,770 B1 | 4/2002 | Lee | |
| 6,410,983 B1 | 6/2002 | Moriizumi et al. | |
| 6,423,640 B1 | 7/2002 | Lee et al. | |
| 6,465,892 B1 | 10/2002 | Suga | |
| 6,582,991 B1 | 6/2003 | Maeda et al. | |
| 6,686,588 B1 | 2/2004 | Webster et al. | |
| 6,713,857 B1 | 3/2004 | Tsai | |
| 6,887,769 B2 | 5/2005 | Kellar et al. | |
| 6,908,027 B2 | 6/2005 | Tolchinsky et al. | |
| 7,045,453 B2 | 5/2006 | Canaperi et al. | |
| 7,078,811 B2 | 7/2006 | Suga | |
| 7,105,980 B2 | 9/2006 | Abbott et al. | |
| 7,126,212 B2 | 10/2006 | Enquist et al. | |
| 7,193,423 B1 | 3/2007 | Dalton et al. | |
| 7,262,492 B2 | 8/2007 | Pieda et al. | |
| 7,354,798 B2 | 4/2008 | Pogge et al. | |
| 7,750,488 B2 | 7/2010 | Patti et al. | |
| 7,781,309 B2 | 8/2010 | Morita et al. | |
| 7,790,578 B2 | 9/2010 | Furui | |
| 7,803,693 B2 | 9/2010 | Trezza | |
| 7,816,235 B2 | 10/2010 | Chan et al. | |
| 7,843,052 B1 | 11/2010 | Yoo et al. | |
| 7,932,616 B2 | 4/2011 | Meguro | |
| 8,026,181 B2 | 9/2011 | Arita et al. | |
| 8,044,497 B2 | 10/2011 | Cheah et al. | |
| 8,178,963 B2 | 5/2012 | Yang | |
| 8,178,964 B2 | 5/2012 | Yang | |
| 8,183,127 B2 | 5/2012 | Patti et al. | |
| 8,241,961 B2 | 8/2012 | Kim et al. | |
| 8,314,007 B2 | 11/2012 | Vaufredaz | |
| 8,349,635 B1 | 1/2013 | Gan et al. | |
| 8,377,798 B2 | 2/2013 | Peng et al. | |
| 8,415,783 B1 | 4/2013 | Rahman et al. | |
| 8,441,131 B2 | 5/2013 | Ryan | |
| 8,456,856 B2 | 6/2013 | Lin et al. | |
| 8,476,146 B2 | 7/2013 | Chen et al. | |
| 8,476,165 B2 | 7/2013 | Trickett et al. | |
| 8,482,132 B2 | 7/2013 | Yang et al. | |
| 8,501,537 B2 | 8/2013 | Sadaka et al. | |
| 8,513,088 B2 | 8/2013 | Yoshimura et al. | |
| 8,524,533 B2 | 9/2013 | Tong et al. | |
| 8,620,164 B2 | 12/2013 | Heck et al. | |
| 8,647,987 B2 | 2/2014 | Yang et al. | |
| 8,697,493 B2 | 4/2014 | Sadaka | |
| 8,716,105 B2 | 5/2014 | Sadaka et al. | |
| 8,802,538 B1 | 8/2014 | Liu | |
| 8,809,123 B2 | 8/2014 | Liu et al. | |
| 8,841,002 B2 | 9/2014 | Tong | |
| 8,963,335 B2 | 2/2015 | Woychik et al. | |
| 8,975,163 B1 | 3/2015 | Lei et al. | |
| 8,988,299 B2 | 3/2015 | Kam et al. | |
| 9,059,010 B2 | 6/2015 | Yoshida et al. | |
| 9,076,860 B1 | 7/2015 | Lei et al. | |
| 9,076,929 B2 | 7/2015 | Katsuno et al. | |
| 9,093,350 B2 | 7/2015 | Endo et al. | |
| 9,142,517 B2 | 9/2015 | Liu et al. | |
| 9,171,756 B2 | 10/2015 | Enquist et al. | |
| 9,184,125 B2 | 11/2015 | Enquist et al. | |
| 9,224,704 B2 | 12/2015 | Landru | |
| 9,230,941 B2 | 1/2016 | Chen et al. | |
| 9,257,399 B2 | 2/2016 | Kuang et al. | |
| 9,299,736 B2 * | 3/2016 | Chen ....................... | H01L 24/80 |
| 9,312,229 B2 | 4/2016 | Chen et al. | |
| 9,331,149 B2 | 5/2016 | Tong et al. | |
| 9,337,235 B2 | 5/2016 | Chen et al. | |
| 9,343,433 B2 | 5/2016 | Lee et al. | |
| 9,355,997 B2 | 5/2016 | Katkar et al. | |
| 9,368,866 B2 | 6/2016 | Yu | |
| 9,385,024 B2 | 7/2016 | Tong et al. | |
| 9,394,161 B2 | 7/2016 | Cheng et al. | |
| 9,437,572 B2 | 9/2016 | Chen et al. | |
| 9,443,796 B2 | 9/2016 | Chou et al. | |
| 9,443,824 B1 | 9/2016 | We et al. | |
| 9,461,007 B2 | 10/2016 | Chun et al. | |
| 9,466,586 B1 | 10/2016 | Choi et al. | |
| 9,496,239 B1 | 11/2016 | Edelstein et al. | |
| 9,524,959 B1 | 12/2016 | Yeh et al. | |
| 9,536,848 B2 | 1/2017 | England et al. | |
| 9,559,081 B1 * | 1/2017 | Lai ....................... | H01L 21/7684 |
| 9,570,421 B2 | 2/2017 | Wu et al. | |
| 9,620,481 B2 | 4/2017 | Edelstein et al. | |
| 9,653,433 B2 | 5/2017 | Yu et al. | |
| 9,656,852 B2 | 5/2017 | Cheng et al. | |
| 9,666,502 B2 | 5/2017 | Chen et al. | |
| 9,673,096 B2 | 6/2017 | Hirschler et al. | |
| 9,674,939 B2 | 6/2017 | Scannell | |
| 9,722,098 B1 | 8/2017 | Chung et al. | |
| 9,723,716 B2 | 8/2017 | Meinhold | |
| 9,728,521 B2 | 8/2017 | Tsai et al. | |
| 9,741,620 B2 | 8/2017 | Uzoh et al. | |
| 9,773,741 B1 | 9/2017 | Gu et al. | |
| 9,799,587 B2 | 10/2017 | Fujii et al. | |
| 9,818,729 B1 | 11/2017 | Chiu et al. | |
| 9,852,988 B2 | 12/2017 | Enquist et al. | |
| 9,865,567 B1 | 1/2018 | Chaware et al. | |
| 9,881,882 B2 | 1/2018 | Hsu et al. | |
| 9,893,004 B2 | 2/2018 | Yazdani | |
| 9,899,442 B2 | 2/2018 | Katkar | |
| 9,929,050 B2 | 3/2018 | Lin | |
| 9,941,241 B2 | 4/2018 | Edelstein et al. | |
| 9,941,243 B2 | 4/2018 | Kim et al. | |
| 9,953,941 B2 | 4/2018 | Enquist | |
| 9,960,142 B2 | 5/2018 | Chen et al. | |
| 9,991,231 B2 | 6/2018 | Woychik et al. | |
| 10,008,844 B2 | 6/2018 | Wang et al. | |
| 10,026,605 B2 | 7/2018 | Doub et al. | |
| 10,075,657 B2 | 9/2018 | Fahim et al. | |
| 10,204,893 B2 | 2/2019 | Uzoh et al. | |
| 10,269,756 B2 | 4/2019 | Uzoh | |
| 10,276,619 B2 | 4/2019 | Kao et al. | |
| 10,276,909 B2 | 4/2019 | Huang et al. | |
| 10,333,623 B1 | 6/2019 | Liao et al. | |
| 10,410,976 B2 | 9/2019 | Asano et al. | |
| 10,418,277 B2 | 9/2019 | Cheng et al. | |
| 10,446,456 B2 | 10/2019 | Shen et al. | |
| 10,504,824 B1 | 12/2019 | Pan et al. | |
| 10,510,629 B2 | 12/2019 | Chen et al. | |
| 10,529,637 B1 | 1/2020 | Yu et al. | |
| 10,559,507 B1 | 2/2020 | Saketi et al. | |
| 10,580,823 B2 | 3/2020 | Zhang et al. | |
| 10,636,767 B2 | 4/2020 | Haba | |

(56) References Cited

U.S. PATENT DOCUMENTS

| | | |
|---|---|---|
| 10,672,674 B2 * | 6/2020 | Yu ..................... H01L 21/568 |
| 10,707,087 B2 | 7/2020 | Uzoh et al. |
| 10,707,145 B2 | 7/2020 | Bultitude et al. |
| 10,727,204 B2 | 7/2020 | Agarwal et al. |
| 10,727,219 B2 | 7/2020 | Uzoh et al. |
| 10,770,430 B1 | 9/2020 | Kim et al. |
| 10,790,262 B2 | 9/2020 | Uzoh et al. |
| 10,840,135 B2 | 11/2020 | Uzoh |
| 10,854,578 B2 | 12/2020 | Morein |
| 10,872,852 B2 | 12/2020 | Shih |
| 10,879,212 B2 | 12/2020 | Uzoh et al. |
| 10,879,226 B2 | 12/2020 | Uzoh et al. |
| 10,886,177 B2 | 1/2021 | DeLaCruz et al. |
| 10,892,246 B2 | 1/2021 | Uzoh |
| 10,910,344 B2 | 2/2021 | DeLaCruz et al. |
| 10,923,413 B2 | 2/2021 | DeLaCruz |
| 10,950,547 B2 | 3/2021 | Mohammed et al. |
| 10,964,664 B2 | 3/2021 | Mandalapu et al. |
| 10,985,133 B2 | 4/2021 | Uzoh |
| 10,991,804 B2 | 4/2021 | DeLaCruz et al. |
| 10,998,292 B2 | 5/2021 | Lee et al. |
| 11,011,503 B2 | 5/2021 | Wang et al. |
| 11,031,285 B2 | 6/2021 | Katkar et al. |
| 11,056,348 B2 | 7/2021 | Theil |
| 11,056,390 B2 | 7/2021 | Uzoh et al. |
| 11,088,099 B2 | 8/2021 | Katkar et al. |
| 11,127,738 B2 | 9/2021 | DeLaCruz et al. |
| 11,145,623 B2 | 10/2021 | Hsu et al. |
| 11,145,626 B2 | 10/2021 | Hwang et al. |
| 11,158,606 B2 | 10/2021 | Gao et al. |
| 11,171,117 B2 | 11/2021 | Gao et al. |
| 11,176,450 B2 | 11/2021 | Teig et al. |
| 11,256,004 B2 | 2/2022 | Haba et al. |
| 11,264,357 B1 | 3/2022 | DeLaCruz et al. |
| 11,276,676 B2 | 3/2022 | Enquist et al. |
| 11,329,034 B2 | 5/2022 | Tao et al. |
| 11,348,898 B2 | 5/2022 | DeLaCruz et al. |
| 11,355,427 B2 | 6/2022 | Loo et al. |
| 11,355,443 B2 | 6/2022 | Huang et al. |
| 11,469,214 B2 | 10/2022 | Morein et al. |
| 11,532,551 B2 | 12/2022 | Liu et al. |
| 11,558,029 B2 | 1/2023 | Ito |
| 11,658,173 B2 | 5/2023 | Uzoh et al. |
| 2002/0000328 A1 | 1/2002 | Motomura et al. |
| 2002/0003307 A1 | 1/2002 | Suga |
| 2002/0004288 A1 | 1/2002 | Nishiyama |
| 2002/0047210 A1 | 4/2002 | Yamada et al. |
| 2003/0148591 A1 | 8/2003 | Guo et al. |
| 2004/0084414 A1 | 5/2004 | Sakai et al. |
| 2004/0140546 A1 | 7/2004 | Lee et al. |
| 2004/0188501 A1 | 9/2004 | Tolchinsky et al. |
| 2004/0238927 A1 | 12/2004 | Miyazawa |
| 2005/0040530 A1 | 2/2005 | Shi |
| 2005/0101130 A1 | 5/2005 | Lopatin et al. |
| 2005/0104196 A1 | 5/2005 | Kashiwazaki |
| 2005/0133930 A1 | 6/2005 | Savastisuk et al. |
| 2005/0153522 A1 | 7/2005 | Hwang et al. |
| 2005/0161808 A1 | 7/2005 | Anderson |
| 2006/0057945 A1 | 3/2006 | Hsu et al. |
| 2006/0063312 A1 | 3/2006 | Kurita |
| 2006/0220256 A1 | 10/2006 | Shim et al. |
| 2006/0223216 A1 | 10/2006 | Chang et al. |
| 2006/0234473 A1 | 10/2006 | Wong et al. |
| 2007/0007639 A1 | 1/2007 | Fukazawa et al. |
| 2007/0096294 A1 | 5/2007 | Ikeda et al. |
| 2007/0111386 A1 | 5/2007 | Kim et al. |
| 2007/0122635 A1 | 5/2007 | Lu et al. |
| 2007/0123061 A1 | 5/2007 | Evertsen et al. |
| 2007/0148912 A1 | 6/2007 | Morita et al. |
| 2007/0158024 A1 | 7/2007 | Addison et al. |
| 2007/0222048 A1 | 9/2007 | Huang |
| 2007/0295456 A1 | 12/2007 | Gudeman et al. |
| 2008/0036082 A1 | 2/2008 | Eun |
| 2008/0079105 A1 | 4/2008 | Chang et al. |
| 2008/0142990 A1 | 6/2008 | Yu et al. |
| 2008/0165521 A1 | 7/2008 | Bernstein et al. |
| 2008/0227238 A1 | 9/2008 | Ko et al. |
| 2008/0265421 A1 | 10/2008 | Brunnbauer et al. |
| 2008/0268614 A1 | 10/2008 | Yang et al. |
| 2008/0272477 A1 | 11/2008 | Do et al. |
| 2008/0308928 A1 | 12/2008 | Chang |
| 2008/0315372 A1 | 12/2008 | Kuan et al. |
| 2009/0029274 A1 | 1/2009 | Olson et al. |
| 2009/0068831 A1 | 3/2009 | Enquist et al. |
| 2009/0095399 A1 | 4/2009 | Zussy et al. |
| 2009/0149023 A1 | 6/2009 | Koyanagi |
| 2009/0206461 A1 | 8/2009 | Yoon |
| 2009/0227089 A1 | 9/2009 | Plaut et al. |
| 2009/0252939 A1 | 10/2009 | Park et al. |
| 2009/0273094 A1 | 11/2009 | Ha et al. |
| 2009/0283898 A1 | 11/2009 | Janzen et al. |
| 2010/0081236 A1 | 4/2010 | Yang et al. |
| 2010/0123268 A1 | 5/2010 | Menard |
| 2010/0129999 A1 | 5/2010 | Zingher et al. |
| 2010/0159643 A1 | 6/2010 | Takahashi et al. |
| 2010/0258952 A1 | 10/2010 | Fjelstad |
| 2010/0259166 A1 | 10/2010 | Cok et al. |
| 2010/0315110 A1 | 12/2010 | Fenner et al. |
| 2011/0042814 A1 | 2/2011 | Okuyama |
| 2011/0049696 A1 | 3/2011 | Haba et al. |
| 2011/0074033 A1 | 3/2011 | Kaltalioglu et al. |
| 2011/0165707 A1 | 7/2011 | Lott et al. |
| 2011/0186977 A1 | 8/2011 | Chi et al. |
| 2011/0187005 A1 | 8/2011 | Pagaila et al. |
| 2011/0193211 A1 | 8/2011 | Chandrasekaran et al. |
| 2011/0233702 A1 | 9/2011 | Takahashi et al. |
| 2011/0248397 A1 | 10/2011 | Coffy et al. |
| 2011/0278717 A1 | 11/2011 | Pagaila et al. |
| 2011/0278732 A1 | 11/2011 | Yu et al. |
| 2011/0290552 A1 | 12/2011 | Palmateer et al. |
| 2012/0003792 A1 | 1/2012 | Cheah et al. |
| 2012/0025396 A1 | 2/2012 | Liao et al. |
| 2012/0049344 A1 | 3/2012 | Pagaila et al. |
| 2012/0056314 A1 | 3/2012 | Pagaila et al. |
| 2012/0074585 A1 | 3/2012 | Koo et al. |
| 2012/0077314 A1 | 3/2012 | Park et al. |
| 2012/0098145 A1 | 4/2012 | Yoshida et al. |
| 2012/0187516 A1 | 7/2012 | Sato |
| 2012/0190187 A1 | 7/2012 | Yang et al. |
| 2012/0199930 A1 | 8/2012 | Hayashi |
| 2012/0212384 A1 | 8/2012 | Kam et al. |
| 2012/0217644 A1 | 8/2012 | Pagaila |
| 2012/0228762 A1 | 9/2012 | Fukuda et al. |
| 2012/0238070 A1 | 9/2012 | Libbert et al. |
| 2013/0001798 A1 | 1/2013 | Choi |
| 2013/0037962 A1 | 2/2013 | Xue |
| 2013/0069239 A1 | 3/2013 | Kim et al. |
| 2013/0075923 A1 | 3/2013 | Park et al. |
| 2013/0082399 A1 | 4/2013 | Kim et al. |
| 2013/0122655 A1 | 5/2013 | Yu et al. |
| 2013/0169355 A1 | 7/2013 | Chen et al. |
| 2013/0187292 A1 | 7/2013 | Semmelmeyer et al. |
| 2013/0214427 A1 | 8/2013 | Nakanoya |
| 2013/0234320 A1 | 9/2013 | Lu et al. |
| 2013/0264684 A1 | 10/2013 | Yu et al. |
| 2013/0277855 A1 | 10/2013 | Kang et al. |
| 2013/0299997 A1 | 11/2013 | Sadaka |
| 2013/0334697 A1 | 12/2013 | Shin et al. |
| 2014/0008789 A1 | 1/2014 | Cho |
| 2014/0013606 A1 | 1/2014 | Nah et al. |
| 2014/0042643 A1 | 2/2014 | Yu et al. |
| 2014/0071652 A1 | 3/2014 | McShane et al. |
| 2014/0097536 A1 | 4/2014 | Schunk |
| 2014/0154839 A1 | 6/2014 | Ahn et al. |
| 2014/0175655 A1 | 6/2014 | Chen et al. |
| 2014/0187040 A1 | 7/2014 | Enquist et al. |
| 2014/0217604 A1 | 8/2014 | Chou et al. |
| 2014/0225795 A1 | 8/2014 | Yu |
| 2014/0252605 A1 | 9/2014 | Ma et al. |
| 2014/0263959 A1 | 9/2014 | Hsu et al. |
| 2014/0264836 A1 | 9/2014 | Chun et al. |
| 2014/0299980 A1 | 10/2014 | Choi et al. |
| 2014/0299981 A1 | 10/2014 | Goh et al. |
| 2014/0312511 A1 | 10/2014 | Nakamura |

(56)          References Cited

U.S. PATENT DOCUMENTS

| | | |
|---|---|---|
| 2014/0327150 A1 | 11/2014 | Jung et al. |
| 2014/0370658 A1 | 12/2014 | Tong et al. |
| 2014/0377909 A1 | 12/2014 | Chung et al. |
| 2015/0021754 A1 | 1/2015 | Lin et al. |
| 2015/0048500 A1 | 2/2015 | Yu et al. |
| 2015/0048503 A1 | 2/2015 | Chiu et al. |
| 2015/0064498 A1 | 3/2015 | Tong |
| 2015/0097022 A1 | 4/2015 | Di Cioccio et al. |
| 2015/0102468 A1 | 4/2015 | Kang et al. |
| 2015/0113195 A1 | 4/2015 | Kim |
| 2015/0130030 A1 | 5/2015 | Ma et al. |
| 2015/0130082 A1 | 5/2015 | Lu et al. |
| 2015/0145094 A1 | 5/2015 | Liu et al. |
| 2015/0145140 A1 | 5/2015 | Haba et al. |
| 2015/0162294 A1 | 6/2015 | Kawasaki |
| 2015/0171050 A1 | 6/2015 | Chen et al. |
| 2015/0171063 A1 | 6/2015 | Zhai et al. |
| 2015/0179481 A1 | 6/2015 | Lin |
| 2015/0194406 A1 | 7/2015 | Teh et al. |
| 2015/0200153 A1 | 7/2015 | Wang et al. |
| 2015/0200182 A1 | 7/2015 | Wang et al. |
| 2015/0206865 A1 | 7/2015 | Yu et al. |
| 2015/0235949 A1 | 8/2015 | Yu et al. |
| 2015/0262845 A1 | 9/2015 | Hwang et al. |
| 2015/0270209 A1 | 9/2015 | Woychik et al. |
| 2015/0287672 A1 | 10/2015 | Yazdani |
| 2015/0303174 A1 | 10/2015 | Yu et al. |
| 2015/0325557 A1 | 11/2015 | Yiu et al. |
| 2015/0340285 A1 | 11/2015 | Enquest et al. |
| 2015/0371951 A1 | 12/2015 | Yeh et al. |
| 2016/0020235 A1 | 1/2016 | Yamashita |
| 2016/0035687 A1 | 2/2016 | Lin et al. |
| 2016/0049383 A1 | 2/2016 | Woychik et al. |
| 2016/0071770 A1 | 3/2016 | Albermann et al. |
| 2016/0071779 A1 | 3/2016 | Chen |
| 2016/0093592 A1 | 3/2016 | Zhai |
| 2016/0126634 A1 | 5/2016 | Liu et al. |
| 2016/0141267 A1 | 5/2016 | Hagimoto et al. |
| 2016/0141280 A1 | 5/2016 | Lin et al. |
| 2016/0155724 A1 | 6/2016 | Kim et al. |
| 2016/0163650 A1 | 6/2016 | Gao et al. |
| 2016/0190103 A1 | 6/2016 | Kabe et al. |
| 2016/0218082 A1 | 7/2016 | Lee et al. |
| 2016/0233175 A1 | 8/2016 | Dubey et al. |
| 2016/0233196 A1 | 8/2016 | Kim et al. |
| 2016/0254249 A1 | 9/2016 | Jeng et al. |
| 2016/0254299 A1 | 9/2016 | Gomi |
| 2016/0260684 A1 | 9/2016 | Zhai et al. |
| 2016/0276296 A1 | 9/2016 | Woychik et al. |
| 2016/0300813 A1 | 10/2016 | Zhai et al. |
| 2016/0300817 A1 | 10/2016 | Do et al. |
| 2016/0315071 A1 | 10/2016 | Zhai et al. |
| 2016/0322330 A1 | 11/2016 | Lin et al. |
| 2016/0329284 A1 | 11/2016 | We et al. |
| 2016/0343682 A1 | 11/2016 | Kawasaki |
| 2016/0343695 A1 | 11/2016 | Lin et al. |
| 2016/0358865 A1 | 12/2016 | Shih et al. |
| 2016/0358891 A1 | 12/2016 | Geissler et al. |
| 2016/0372323 A1 | 12/2016 | Doub et al. |
| 2017/0023405 A1 | 1/2017 | Fahim et al. |
| 2017/0062383 A1 | 3/2017 | Yee et al. |
| 2017/0084576 A1 | 3/2017 | Yu et al. |
| 2017/0092680 A1 | 3/2017 | Kwon |
| 2017/0125376 A1 | 5/2017 | Yeh et al. |
| 2017/0125379 A1 | 5/2017 | Chen et al. |
| 2017/0141040 A1 | 5/2017 | Yu et al. |
| 2017/0148764 A1 | 5/2017 | Wang et al. |
| 2017/0148777 A1 | 5/2017 | Bono et al. |
| 2017/0186799 A1 | 6/2017 | Lin et al. |
| 2017/0194271 A1 | 7/2017 | Hsu et al. |
| 2017/0200659 A1 | 7/2017 | Gaynes et al. |
| 2017/0200711 A1 | 7/2017 | Uzoh et al. |
| 2017/0200756 A1 | 7/2017 | Kao et al. |
| 2017/0207158 A1 | 7/2017 | Kang et al. |
| 2017/0243845 A1 | 8/2017 | Lee et al. |
| 2017/0250160 A1 | 8/2017 | Wu et al. |
| 2017/0250161 A1 | 8/2017 | Haba |
| 2017/0256663 A1 | 9/2017 | Matthias |
| 2017/0263518 A1 | 9/2017 | Yu et al. |
| 2017/0263595 A1 | 9/2017 | Kurita et al. |
| 2017/0284951 A1 | 10/2017 | Pindl et al. |
| 2017/0287874 A1 | 10/2017 | Fang et al. |
| 2017/0294422 A1 | 10/2017 | Solimando et al. |
| 2017/0301650 A1* | 10/2017 | Yu ............... H01L 24/89 |
| 2017/0330855 A1 | 11/2017 | Tung et al. |
| 2017/0345761 A1 | 11/2017 | Yu et al. |
| 2017/0358533 A1 | 12/2017 | Briggs et al. |
| 2017/0358553 A1 | 12/2017 | Kim et al. |
| 2017/0365580 A1 | 12/2017 | Shih et al. |
| 2017/0365591 A1 | 12/2017 | Chang et al. |
| 2018/0005992 A1 | 1/2018 | Yu et al. |
| 2018/0006006 A1 | 1/2018 | Kim et al. |
| 2018/0012787 A1 | 1/2018 | Oka et al. |
| 2018/0012863 A1 | 1/2018 | Yu et al. |
| 2018/0012868 A1 | 1/2018 | Huang et al. |
| 2018/0053746 A1 | 2/2018 | Yu et al. |
| 2018/0061741 A1 | 3/2018 | Beyne |
| 2018/0068958 A1 | 3/2018 | Cho et al. |
| 2018/0068978 A1 | 3/2018 | Jeng et al. |
| 2018/0096931 A1 | 4/2018 | Huang et al. |
| 2018/0096988 A1 | 4/2018 | Long et al. |
| 2018/0122774 A1 | 5/2018 | Huang et al. |
| 2018/0130691 A1 | 5/2018 | Uzoh |
| 2018/0130769 A1 | 5/2018 | Tan et al. |
| 2018/0130772 A1 | 5/2018 | Yu et al. |
| 2018/0138101 A1 | 5/2018 | Yu et al. |
| 2018/0151477 A1 | 5/2018 | Yu et al. |
| 2018/0158749 A1 | 6/2018 | Yu et al. |
| 2018/0175008 A1 | 6/2018 | Fong et al. |
| 2018/0175012 A1 | 6/2018 | Wu et al. |
| 2018/0182639 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0219038 A1 | 8/2018 | Gambino et al. |
| 2018/0226375 A1 | 8/2018 | Enquist et al. |
| 2018/0269143 A1 | 9/2018 | Adams et al. |
| 2018/0273377 A1 | 9/2018 | Katkar et al. |
| 2018/0286805 A1 | 10/2018 | Huang et al. |
| 2018/0294212 A1 | 10/2018 | Chen et al. |
| 2018/0301443 A1 | 10/2018 | Kim et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2018/0337157 A1 | 11/2018 | Wang et al. |
| 2018/0342435 A1 | 11/2018 | Yu et al. |
| 2018/0366436 A1 | 12/2018 | Wang et al. |
| 2018/0366437 A1 | 12/2018 | Chen et al. |
| 2018/0366442 A1 | 12/2018 | Gu et al. |
| 2018/0366446 A1 | 12/2018 | Haba et al. |
| 2019/0006263 A1 | 1/2019 | Yu et al. |
| 2019/0029119 A1 | 1/2019 | Weber |
| 2019/0043792 A1 | 2/2019 | Weerasekera et al. |
| 2019/0043910 A1 | 2/2019 | Miyazawa et al. |
| 2019/0043914 A1 | 2/2019 | von Känel |
| 2019/0067247 A1 | 2/2019 | Yoo et al. |
| 2019/0088621 A1 | 3/2019 | Yang et al. |
| 2019/0096741 A1 | 3/2019 | Uzoh et al. |
| 2019/0096825 A1 | 3/2019 | Kim et al. |
| 2019/0096842 A1 | 3/2019 | Fountain, Jr. et al. |
| 2019/0103409 A1 | 4/2019 | Xu et al. |
| 2019/0103425 A1 | 4/2019 | Yoon et al. |
| 2019/0109119 A1 | 4/2019 | Shih et al. |
| 2019/0115277 A1 | 4/2019 | Yu et al. |
| 2019/0123006 A1 | 4/2019 | Chen et al. |
| 2019/0131276 A1 | 5/2019 | Chen et al. |
| 2019/0131277 A1 | 5/2019 | Yang et al. |
| 2019/0157333 A1 | 5/2019 | Tsai |
| 2019/0189562 A9 | 6/2019 | Yu et al. |
| 2019/0189590 A1 | 6/2019 | Agarwal et al. |
| 2019/0189607 A1 | 6/2019 | Uzoh et al. |
| 2019/0198407 A1 | 6/2019 | Huang et al. |
| 2019/0198409 A1 | 6/2019 | Katkar et al. |
| 2019/0206791 A1 | 7/2019 | Pietambaram et al. |

(56) References Cited

U.S. PATENT DOCUMENTS

| | | |
|---|---|---|
| 2019/0214347 A1 | 7/2019 | Huang et al. |
| 2019/0214423 A1 | 7/2019 | Kim et al. |
| 2019/0221548 A1 | 7/2019 | Huang et al. |
| 2019/0237374 A1 | 8/2019 | Huang et al. |
| 2019/0265411 A1 | 8/2019 | Huang et al. |
| 2019/0267334 A1 | 8/2019 | Bowers |
| 2019/0319007 A1 | 10/2019 | Uzoh et al. |
| 2019/0333550 A1 | 10/2019 | Fisch |
| 2019/0333871 A1 | 10/2019 | Chen et al. |
| 2019/0341306 A1 | 11/2019 | Yu et al. |
| 2019/0341350 A1 | 11/2019 | Huang et al. |
| 2019/0348336 A1 | 11/2019 | Katkar et al. |
| 2019/0355637 A1 | 11/2019 | Chen et al. |
| 2019/0355706 A1 | 11/2019 | Enquist et al. |
| 2019/0371763 A1 | 12/2019 | Agarwal et al. |
| 2019/0372000 A1 | 12/2019 | Yu et al. |
| 2019/0385935 A1 | 12/2019 | Gao et al. |
| 2019/0385966 A1 | 12/2019 | Gao et al. |
| 2019/0385981 A1 | 12/2019 | Chen et al. |
| 2020/0006173 A1 | 1/2020 | Chen et al. |
| 2020/0006309 A1 | 1/2020 | Chen et al. |
| 2020/0013637 A1 | 1/2020 | Haba |
| 2020/0013667 A1 | 1/2020 | Leobandung |
| 2020/0013754 A1 | 1/2020 | Gao et al. |
| 2020/0013765 A1 | 1/2020 | Fountain, Jr. et al. |
| 2020/0035560 A1 | 1/2020 | Block et al. |
| 2020/0035641 A1 | 1/2020 | Fountain, Jr. et al. |
| 2020/0043853 A1 | 2/2020 | Kim et al. |
| 2020/0075520 A1 | 3/2020 | Gao et al. |
| 2020/0075534 A1 | 3/2020 | Gao et al. |
| 2020/0075553 A1 | 3/2020 | DeLaCruz et al. |
| 2020/0091217 A1 | 3/2020 | Horikoshi et al. |
| 2020/0098736 A1 | 3/2020 | Liao et al. |
| 2020/0106156 A1 | 4/2020 | Lu et al. |
| 2020/0118973 A1 | 4/2020 | Wang et al. |
| 2020/0126906 A1 | 4/2020 | Uzoh et al. |
| 2020/0135684 A1 | 4/2020 | Kim et al. |
| 2020/0161263 A1 | 5/2020 | Chen et al. |
| 2020/0176419 A1 | 6/2020 | Dabral et al. |
| 2020/0185322 A1 | 6/2020 | Zhang et al. |
| 2020/0185367 A1 | 6/2020 | Bhagavat et al. |
| 2020/0194396 A1 | 6/2020 | Uzoh |
| 2020/0227367 A1 | 7/2020 | Haba et al. |
| 2020/0227377 A1 | 7/2020 | Liff et al. |
| 2020/0243380 A1 | 7/2020 | Uzoh et al. |
| 2020/0279821 A1 | 9/2020 | Haba et al. |
| 2020/0294908 A1 | 9/2020 | Haba et al. |
| 2020/0294920 A1 | 9/2020 | Hariri et al. |
| 2020/0303311 A1 | 9/2020 | Young et al. |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0335408 A1 | 10/2020 | Gao et al. |
| 2020/0371154 A1 | 11/2020 | DeLaCruz et al. |
| 2020/0395300 A1 | 12/2020 | Xie et al. |
| 2020/0395321 A1 | 12/2020 | Katkar et al. |
| 2020/0402951 A1 | 12/2020 | Chen et al. |
| 2020/0403006 A1 | 12/2020 | DeLaCruz et al. |
| 2020/0411483 A1 | 12/2020 | Uzoh et al. |
| 2021/0020577 A1 | 1/2021 | Hu |
| 2021/0028080 A1 | 1/2021 | Pietambaram et al. |
| 2021/0028145 A1 | 1/2021 | Yu et al. |
| 2021/0057309 A1 | 2/2021 | Hu et al. |
| 2021/0057343 A1 | 2/2021 | Chang et al. |
| 2021/0057352 A1 | 2/2021 | Agarwal et al. |
| 2021/0066219 A1 | 3/2021 | Chen et al. |
| 2021/0082797 A1 | 3/2021 | Lee et al. |
| 2021/0082822 A1 | 3/2021 | Aleksov et al. |
| 2021/0082825 A1 | 3/2021 | Strong et al. |
| 2021/0098411 A1 | 4/2021 | Liff et al. |
| 2021/0098412 A1 | 4/2021 | Haba et al. |
| 2021/0098421 A1 | 4/2021 | Wu et al. |
| 2021/0104487 A1 | 4/2021 | Uzoh et al. |
| 2021/0111125 A1 | 4/2021 | Chen et al. |
| 2021/0118832 A1 | 4/2021 | Chen et al. |
| 2021/0118864 A1 | 4/2021 | DeLaCruz et al. |
| 2021/0125933 A1 | 4/2021 | Chen et al. |
| 2021/0125965 A1 | 4/2021 | Lu |
| 2021/0134724 A1 | 5/2021 | Rubin et al. |
| 2021/0143125 A1 | 5/2021 | DeLaCruz et al. |
| 2021/0175199 A1 | 6/2021 | Song et al. |
| 2021/0181510 A1 | 6/2021 | Katkar et al. |
| 2021/0183847 A1 | 6/2021 | Uzoh et al. |
| 2021/0193603 A1 | 6/2021 | Katkar et al. |
| 2021/0193624 A1 | 6/2021 | DeLaCruz et al. |
| 2021/0193625 A1 | 6/2021 | DeLaCruz et al. |
| 2021/0202396 A1 | 7/2021 | Wu et al. |
| 2021/0225708 A1 | 7/2021 | Lee et al. |
| 2021/0225780 A1 | 7/2021 | Wu et al. |
| 2021/0242152 A1 | 8/2021 | Fountain, Jr. et al. |
| 2021/0280507 A1 | 9/2021 | Aldrete et al. |
| 2021/0280517 A1 | 9/2021 | May et al. |
| 2021/0280522 A1 | 9/2021 | Liu |
| 2021/0296282 A1 | 9/2021 | Gao et al. |
| 2021/0305122 A1 | 9/2021 | Lai et al. |
| 2021/0305202 A1 | 9/2021 | Uzoh et al. |
| 2021/0335726 A1 | 10/2021 | Wu et al. |
| 2021/0366820 A1 | 11/2021 | Uzoh |
| 2021/0375708 A1 | 12/2021 | Kuo et al. |
| 2021/0375737 A1 | 12/2021 | Lin |
| 2021/0375827 A1 | 12/2021 | Chen et al. |
| 2021/0384133 A1 | 12/2021 | Ong et al. |
| 2021/0384135 A1 | 12/2021 | Kuan et al. |
| 2021/0384158 A1 | 12/2021 | Chung et al. |
| 2021/0391271 A1 | 12/2021 | Hsu et al. |
| 2021/0391272 A1 | 12/2021 | Tsai et al. |
| 2021/0391283 A1 | 12/2021 | Hsu et al. |
| 2021/0391284 A1 | 12/2021 | Hsu et al. |
| 2021/0391301 A1 | 12/2021 | Tomishima et al. |
| 2021/0407941 A1 | 12/2021 | Haba |
| 2022/0005787 A1 | 1/2022 | Han et al. |
| 2022/0020729 A1 | 1/2022 | Gao et al. |
| 2022/0077063 A1 | 3/2022 | Haba |
| 2022/0077087 A1 | 3/2022 | Haba |
| 2022/0139867 A1 | 5/2022 | Uzoh |
| 2022/0139869 A1 | 5/2022 | Gao et al. |
| 2022/0189941 A1 | 6/2022 | Enquist et al. |
| 2022/0199560 A1 | 6/2022 | Haba et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0208735 A1 | 6/2022 | Yu et al. |
| 2022/0246497 A1 | 8/2022 | Fountain, Jr. et al. |
| 2022/0271012 A1 | 8/2022 | Chen et al. |
| 2022/0278084 A1 | 9/2022 | Ong et al. |
| 2022/0285303 A1 | 9/2022 | Mirkarimi et al. |
| 2022/0293567 A1 | 9/2022 | Uzoh et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2022/0336393 A1 | 10/2022 | Chen et al. |
| 2022/0359468 A1 | 11/2022 | Tsai et al. |
| 2022/0399294 A1 | 12/2022 | Dogiamis et al. |
| 2022/0399305 A1 | 12/2022 | Choi et al. |
| 2022/0415837 A1 | 12/2022 | Jun et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0060265 A1 | 3/2023 | Chang et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0130580 A1 | 4/2023 | Uzoh et al. |
| 2023/0131849 A1 | 4/2023 | Uzoh et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |

(56)                 References Cited

U.S. PATENT DOCUMENTS

| | | |
|---|---|---|
| 2023/0170328 A1 | 6/2023 | Chuang et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |
| 2023/0245950 A1 | 8/2023 | Haba et al. |
| 2023/0268300 A1 | 8/2023 | Uzoh et al. |
| 2023/0317653 A1 | 10/2023 | Feng et al. |
| 2023/0420418 A1 | 12/2023 | Ting et al. |
| 2024/0038702 A1 | 2/2024 | Uzoh |
| 2024/0047417 A1 | 2/2024 | Yeh et al. |
| 2024/0071969 A1 | 2/2024 | Kirby et al. |
| 2024/0096722 A1 | 3/2024 | Yee et al. |
| 2024/0096831 A1 | 3/2024 | Jo et al. |
| 2024/0332231 A1 | 10/2024 | Uzoh |
| 2024/0332269 A1 | 10/2024 | Zeng et al. |
| 2025/0343185 A1 | 11/2025 | Uzoh |

FOREIGN PATENT DOCUMENTS

| | | | |
|---|---|---|---|
| CN | 105810649 | A | 7/2016 |
| CN | 107527885 | | 12/2017 |
| CN | 109155301 | A | 1/2019 |
| CN | 112687701 | A | 4/2021 |
| DE | 102019128274 | A1 | 12/2020 |
| EP | 2 339 614 | A1 | 6/2011 |
| EP | 2 685 491 | A2 | 1/2014 |
| JP | 04-337694 | | 11/1992 |
| JP | 2000-100679 | | 4/2000 |
| JP | 2001-102479 | | 4/2001 |
| JP | 2002-353416 | | 12/2002 |
| JP | 2004-193493 | | 7/2004 |
| JP | 2007-294724 | A | 11/2007 |
| JP | 2009-135348 | | 6/2009 |
| JP | 2009-212315 | A | 9/2009 |
| JP | 2010-034294 | A | 2/2010 |
| JP | 2010-073964 | | 4/2010 |
| JP | 2011001412 | A | 1/2011 |
| JP | 2011-171614 | | 9/2011 |
| JP | 2013-33786 | | 2/2013 |
| JP | 2013-168577 | A | 8/2013 |
| JP | 2018-160519 | | 10/2018 |
| KR | 10-2001-0104643 | | 11/2001 |
| KR | 10-2004-0020827 | | 3/2004 |
| KR | 10-2010-0123755 | | 11/2010 |
| KR | 2011-0033367 | A | 3/2011 |
| KR | 10-2015-0097798 | | 8/2015 |
| KR | 10-2018-0054419 | | 5/2018 |
| KR | 10-2020-0060670 | | 6/2020 |
| KR | 10-2020-0092236 | | 8/2020 |
| TW | I464810 | B | 12/2014 |
| TW | 202006838 | A | 2/2020 |
| WO | WO 2005/043584 | A2 | 5/2005 |
| WO | WO 2006/100444 | A1 | 9/2006 |
| WO | WO 2009/005898 | A1 | 1/2009 |
| WO | WO 2010/024678 | A1 | 3/2010 |
| WO | WO 2014/052445 | A1 | 4/2014 |
| WO | WO 2015/134227 | A1 | 9/2015 |
| WO | WO 2017/034654 | A1 | 3/2017 |
| WO | WO 2017/052652 | A1 | 3/2017 |
| WO | WO 2017/151442 | A1 | 9/2017 |
| WO | WO 2019/054364 | A1 | 3/2019 |

OTHER PUBLICATIONS

Chang, T.C. et al., "A method for fabricating a superior oxide/nitride/oxide gate stack," Electrochemical and Solid-State Letters, 2004, vol. 7, No. 7, pp. G138-G140.

Chung et al., "Room temperature GaAseu + Si and InPeu + Si wafer direct bonding by the surface activate bonding method," Nuclear Instruments and Methods in Physics Research Section B: Beam Interactions with Materials and Atoms, Jan. 2, 1997, vol. 121, Issues 1-4, pp. 203-206.

Chung et al., "Wafer direct bonding of compound semiconductors and silicon at room temperature by the surface activated bonding method," Applied Surface Science, Jun. 2, 1997, vols. 117-118, pp. 808-812.

"Die-to-Wafer Fusion and Hybrid Bonding," EV Group, https://www.evgroup.com/technologies/die-to-wafer-fusion-and-hybrid-bonding/, printed Sep. 21, 2022, 8 pages.

Farrens et al., "Chemical free room temperature wafer to wafer direct bonding," J. Electrochem. Soc., The Electrochemical Society, Inc., Nov. 1995, vol. 142, No. 11. pp. 3949-3955.

Farrens et al., "Chemical free wafer bonding of silicon to glass and sapphire," Electrochemical Society Proceedings vol. 95-7, 1995, pp. 72-77.

Frumusanu, Andrei, "TSMC's version of EMIB is 'LSI': Currently in pre-qualification," AnaandTech, https://www.anandtech.com/show/16031/tsmcs-version-of-emib-Isi-3dfabric, Aug. 25, 2020, 6 pages.

Fukushima, T. et al., "New three-dimensional integration technology using self-assembly technique," International Electron Devices Meeting 5-7.12.2005, IEEE, Dec. 5, 2005, pp. 348-351.

Gao, G. et al., "Low temperature hybrid bonding for die to wafer stacking applications," 2021 IEEE 71st Electronic Components and Technology Conference (ECTC), IEEE, Jun. 1, 2021-Jul. 4, 2021.

Gösele et al., "Semiconductor Wafer Bonding: A flexible approach to materials combinations in microelectronics; micromechanics and optoelectronics," IEEE, 1997, pp. 23-32.

Hooper, A. et al. "Review of wafer dicing techniques for via-middle process 3DI/TSV ultrathin silicon device wafers," 2015 IEEE 65th Electronic Components and Technology Conference (ECTC).

Hosoda et al., "Effect of the surface treatment on the room-temperature bonding of Al to Si and SiO2," Journal of Materials Science, Jan. 1, 1998, vol. 33, Issue 1, pp. 253-258.

Hosoda et al., "Room temperature GaAs—Si and InP—Si wafer direct bonding by the surface activated bonding method," Nuclear Inst. And Methods in Physics Research B, 1997, vol. 121, Nos. 1-4, pp. 203-206.

Howlader et al., "A novel method for bonding of ionic wafers," Electronics Components and Technology Conference, 2006, IEEE, pp. 7-pp.

Howlader et al., "Bonding of p-Si/n-InP wafers through surface activated bonding method at room temperature," Indium Phosphide and Related Materials, 2001, IEEE International Conference On, pp. 272-275.

Howlader et al., "Characterization of the bonding strength and interface current of p-Si/ n-InP wafers bonded by surface activated bonding method at room temperature," Journal of Applied Physics, Mar. 1, 2002, vol. 91, No. 5, pp. 3062-3066.

Howlader et al., "Investigation of the bonding strength and interface current of p-SionGaAs wafers bonded by surface activated bonding at room temperature," J. Vac. Sci. Technol. B 19, Nov./Dec. 2001, pp. 2114-2118.

International Search Report and Written Opinion mailed Sep. 22, 2017, issued in International Application No. PCT/US2017/029187, 20 pages.

International Search Report and Written Opinion mailed Apr. 22, 2019 in International Application No. PCT/US2018/064982, 13 pages.

International Search Report and Written Opinion mailed May 7, 2020, issued in International Application No. PCT/US2020/013377, 16 pages.

Itoh et al., "Characteristics of fritting contacts utilized for micromachined wafer probe cards," 2000 American Institute of Physics, AIP Review of Scientific Instruments, vol. 71, 2000, pp. 2224.

(56)             References Cited

OTHER PUBLICATIONS

Itoh et al., "Characteristics of low force contact process for MEMS probe cards," Sensors and Actuators A: Physical, Apr. 1, 2002, vols. 97-98, pp. 462-467.

Itoh et al., "Development of MEMS IC probe card utilizing fritting contact," Initiatives of Precision Engineering at the Beginning of a Millennium: 10th International Conference on Precision Engineering (ICPE) Jul. 18-20, 2001, Yokohama, Japan, 2002, Book Part 1, pp. 314-318.

Itoh et al., "Room temperature vacuum sealing using surface activated bonding method," The 12th International Conference on Solid State Sensors, Actuators and Microsystems, Boston, Jun. 8-12, 2003, 2003 IEEE, pp. 1828-1831.

Jin, H. et al., "Silicon / Silicon Oxide / LPCVD Silicon Nitride Stacks: The Effect of Oxide Thickness on Bulk Damage and Surface Passivation," Centre for Sustainable Energy Systems, Faculty of Engineering and Information Technology, The Australian National University, Canberra ACT 0200, Australia, 3 pages.

Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.

Kim et al., "Low temperature direct Cu—Cu bonding with low energy ion activation method," Electronic Materials and Packaging, 2001, IEEE, pp. 193-195.

Kim et al., "Room temperature Cu—Cu direct bonding using surface activated bonding method," J. Vac. Sci. Technol., 2003 American Vacuum Society, Mar./Apr. 2003, vol. 21, No. 2, pp. 449-453.

Kim et al., "Wafer-scale activated bonding of Cu—Cu, Cu—Si, and Cu—SiO2 at low temperature," Proceedings—Electrochemical Society, 2003, vol. 19, pp. 239-247.

"Lecture 29: Productivity and process yield," National Programme on Technology Enhanced Learning (NPTEL), MM5017: Electronic materials, devices, and fabrication, 16 pages.

Matsuzawa et al., "Room-temperature interconnection of electroplated Au microbump by means of surface activated bonding method," Electornic Components and Technology Confererence, 2001, 51st Proceedings, IEEE, pp. 384-387.

Moriceau, H. et al., "Overview of recent direct wafer bonding advances and applications," Advances in Natural Sciences—Nanoscience and Nanotechnology, 2010, 11 pages.

Nakanishi, H. et al., "Studies on SiO2—SiO2 bonding with hydrofluoric acid. Room temperature and low stress bonding technique for MEMS," Sensors and Actuators, 2000, vol. 79, pp. 237-244.

Oberhammer, J. et al., "Sealing of adhesive bonded devices on wafer level," Sensors and Actuators A, 2004, vol. 110, No. 1-3, pp. 407-412, see pp. 407-412, and Figures 1(a)-1(I), 6 pages.

Onodera et al., "The effect of prebonding heat treatment on the separability of Au wire from Ag-plated Cu alloy substrate," Electronics Packaging Manufacturing, IEEE Transactions, Jan. 2002, vol. 25, Issue 1, pp. 5-12.

Plobi, A. et al., "Wafer direct bonding: tailoring adhesion between brittle materials," Materials Science and Engineering Review Journal, 1999, R25, 88 pages.

Reiche et al., "The effect of a plasma pretreatment on the Si/Si bonding behaviouir," Electrochemical Society Proceedings, 1998, vol. 97-36, pp. 437-444.

Roberds et al., "Low temperature , in situ, plasma activated wafer bonding," Electrochecmical Society Proceedings, 1997, vol. 97-36, pp. 598-606.

Shigetou et al., "Room temperature bonding of ultra-fine pitch and low-profiled Cu electrodes for bump-less interconnect," 2003 Electronic Components and Technology Conference, pp. 848-852.

Shigetou et al., "Room-temperature direct bonding of CmP—Cu film for bumpless interconnection," Electronic Components and Technology Confererence, 51st Proceedings, 2001, IEEE, pp. 755-760.

Shingo et al., "Design and fabrication of an electrostatically actuated MEMS probe card," Tranducers, Solid-State Sensors, Actuators and Microsystems, 12th International Conference, Jun. 8-12, 2003, vol. 2, pp. 1522-1525.

Suga et al., "A new approach to Cu—Cu direct bump bonding," IEMT/IMC Symposium, 1997, Joint International Electronic Manufacturing Symposium and the International Microelectronics Conference, Apr. 16-18, 1997, IEEE, pp. 146-151.

Suga et al., "A new bumping process using lead-free solder paste," Electronics Packaging Manufacturing, IEEE Transactions on (vol. 25, Issue 4), IEEE, Oct. 2002, pp. 253-256.

Suga et al., "A new wafer-bonder of ultra-high precision using surface activated bonding (SAB) concept," Electronic Components and Technology Conference, 2001, IEEE, pp. 1013-1018.

Suga et al., "Bump-less interconnect for next generation system packaging," Electronic Components and Technology Conference, 2001, IEEE, pp. 1003-1008.

Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.

Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.

Suga et al., "Surface activated bonding—an approach to joining at room temperature," Ceramic Transactions: Structural Ceramics Joining II, The American Ceramic Society, 1993, pp. 323-331.

Suga et al., "Surface activated bonding for new flip chip and bumpless interconnect systems," Electronic Components and Technology Conference, 2002, IEEE, pp. 105-111.

Suga, "UHV room temperature joining by the surface activated bonding method," Advances in science and technology, Techna, Faenza, Italie, 1999, pp. C1079-C1089.

Takagi et al., "Effect of surface roughness on room-temperature wafer bonding by Ar beam surface activation," Japanese Journal of Applied Physics, 1998, vol. 37, Part 1, No. 1, pp. 4197.

Takagi et al., "Low temperature direct bonding of silicon and silicon dioxide by the surface activation method," Solid State Sensors and Actuators, 1997, Transducers '97 Chicago, 1997 International Conference, vol. 1, pp. 657-660.

Takagi et al., "Room-temperature bonding of lithium niobate and silicon wafers by argon-beam surface activation," Appl. Phys. Lett., 1999. vol. 74, pp. 2387.

Takagi et al., "Room temperature silicon wafer direct bonding in vacuum by Ar beam irradiation," Micro Electro Mehcanical Systems, MEMS '97 Proceedings, 1997, IEEE, pp. 191-196.

Takagi et al., "Room-temperature wafer bonding of Si to LiNbO3, LiTaO3 and Gd3Ga5O12 by Ar-beam surface activation," Journal of Micromechanics and Microengineering, 2001, vol. 11, No. 4, pp. 348.

Takagi et al., "Room-temperature wafer bonding of silicon and lithium niobate by means of arbon-beam surface activation," Integrated Ferroelectrics: An International Journal, 2002, vol. 50, Issue 1, pp. 53-59.

Takagi et al., "Surface activated bonding silicon wafers at room temperature," Appl. Phys. Lett. 68, 2222 (1996).

Takagi et al., "Wafer-scale room-temperature bonding between silicon and ceramic wafers by means of argon-beam surface activation," Micro Electro Mechanical Systems, 2001, MEMS 2001, The 14th IEEE International Conference, Jan. 25, 2001, IEEE, pp. 60-63.

Takagi et al., "Wafer-scale spontaneous bonding of silicon wafers by argon-beam surface activation at room temperature," Sensors and Actuators A: Physical, Jun. 15, 2003, vol. 105, Issue 1, pp. 98-102.

"The effects of edge trimming—Engineering R&D Division, Operation V," Disco Technical Review Mar. 2016, 3 pages.

Tong et al., "Low temperature wafer direct bonding," Journal of Microelectomechanical systems, Mar. 1994, vol. 3, No. 1, pp. 29-35.

(56)                    References Cited

OTHER PUBLICATIONS

Topol et al., "Enabling technologies for wafer-level bonding of 3D MEMS and integrated circuit structures," 2004 Electronics Components and Technology Conference, 2004 IEEE, pp. 931-938.

Uhrmann, T. et al., "Heterogeneous integration by collective die-to-wafer bonding," Chip Scale Review, Nov./Dec. 2018, vol. 22, No. 6, pp. 10-12.

Wang et al., "Reliability and microstructure of Au—Al and Au—Cu direct bonding fabricated by the Surface Activated Bonding," Electronic Components and Technology Conference, 2002, IEEE, pp. 915-919.

Wang et al., "Reliability of Au bump—Cu direct interconnections fabricated by means of surface activated bonding method," Microelectronics Reliability, May 2003, vol. 43, Issue 5, pp. 751-756.

Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.

Xu et al., "New Au—Al interconnect technology and its reliability by surface activated bonding," Electronic Packaging Technology Proceedings, Oct. 28-30, 2003, Shanghai, China, pp. 479-483.

Ceramic Microstructures: Control at the Atomic Level, Recent Progress in Surface Activated Bonding, 1998, pp. 385-389.

Bush, Steve, "Electronica: Automotive power modules from On Semi," ElectronicsWeekly.com, indicating an Onsemi AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

Onsemi AR0820 image, cross section of a CMOS image sensor product. The part in the image was shipped on Sep. 16, 2021. Applicant makes no representation that the part in the image is identical to the part identified in the separately submitted reference Bush, Nov. 8, 2018, ElectronicsWeekly.com ("Bush article"); however, the imaged part and the part shown in the Bush article share the part number "Onsemi AR0820.".

Sony IMX260 image, cross section of Sony dual-pixel sensor product labeled IMX260, showing peripheral probe and wire bond pads in a bonded structure. The part in the image was shipped in Apr. 2016. Applicant makes no representation that the part in the image is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260.".

* cited by examiner

Continue wafer to wafer stacking and carrier release

Final singulation

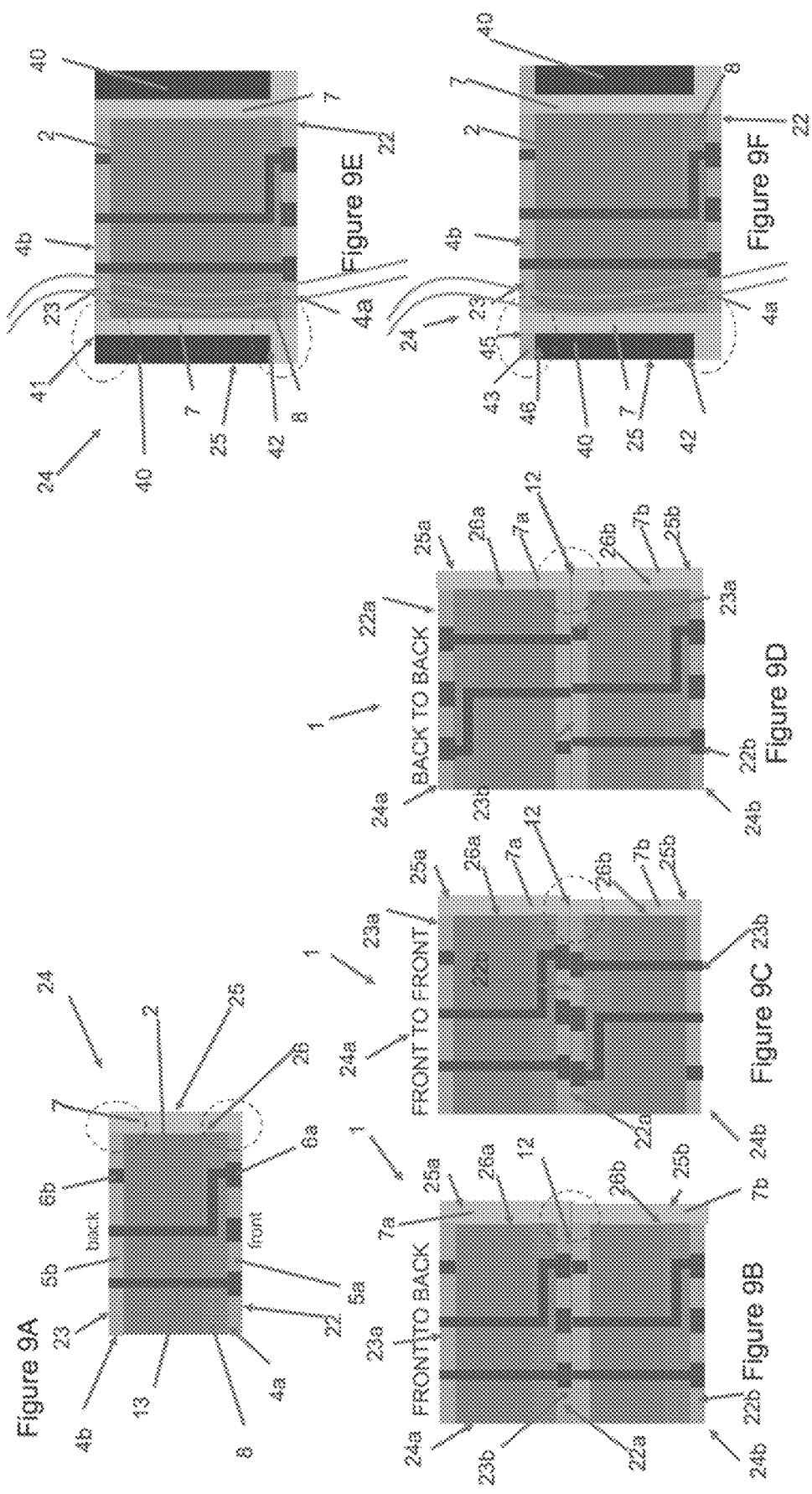

BONDED STRUCTURES WITHOUT INTERVENING ADHESIVE

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57. This application is a continuation of U.S. patent application Ser. No. 17/563,506, filed Dec. 28, 2021, which is a continuation of U.S. patent application Ser. No. 16/741,575, filed Jan. 13, 2020, which claims priority to U.S. Patent Application No. 62/792,360, filed Jan. 14, 2019, the entire contents of which are incorporated by reference in their entirety and for all purposes.

BACKGROUND

Field

The field relates to bonded structures and methods for forming the same.

Description of the Related Art

In various packaging arrangements, it can be advantageous to stack multiple integrated device dies within a low-profile package. For example, three-dimensional (3D) integration techniques often utilize packages in which two or more integrated device dies are stacked on top of and electrically connected to one another. Conventional methods for die thinning and/or 3D integration may have limited product yield because stresses imparted to the dies during assembly may damage dies in the stack, and because it can be challenging to reliably align and connect stacked dies. Accordingly, there remains a continuing need for improved systems and methods for stacking integrated device dies.

BRIEF DESCRIPTION OF THE DRAWINGS

These aspects and others will be apparent from the following description of preferred embodiments and the accompanying drawing, which is meant to illustrate and not to limit the invention, wherein:

FIGS. 9A-9F illustrate various face up bonded structures, according to various embodiments.

DETAILED DESCRIPTION

Various embodiments disclosed herein relate to a bonded structure comprising a first element (e.g., a first integrated device die) having a first side and a second side opposite the first side. The bonded structure can include a second element (e.g., a second integrated device die) having a first side and a second side opposite the first side. The first side of the second integrated device die can be directly bonded to the first side of the first integrated device die without an intervening adhesive along a bonding interface. A protective material can be disposed about a periphery (e.g., respective sidewalls) of the first and second integrated device dies. The protective material can extend from the second side of the first integrated device die to the second side of the second integrated device die. In various embodiments, portions of the protective material can be disposed within gaps between adjacent first integrated device dies or elements. In some embodiments, the protective material can comprise an inorganic dielectric, such as silicon dioxide, silicon nitride, polysilicon, amorphous silicon, etc.

The embodiments disclosed herein can comprise wafer-level processes in which wafers or substrates, serving as carriers, are provided with a plurality of integrated device dies and a protective material (which can comprise one or a plurality of protective layers) over the integrated device dies. The die(s) and protective material can form at least a portion of a reconstituted wafer which can be bonded (e.g., directly bonded without an adhesive) to another reconstituted wafer formed by a similar process. The bonded reconstituted wafers can be singulated to form a plurality of bonded structures, for example after removal of the carriers. The bonded structures can comprise packaging structures in some embodiments. As used herein, direct bond interconnects, or DBI®, can comprise bonded structures in which densely dispersed conductive contacts are bonded to one another without an intervening adhesive. In various embodiments, the surrounding dielectric or nonconductive materials can also be directly bonded without an intervening adhesive. A ZiBond® process can comprise a direct bond between nonconductive materials without an intervening adhesive. Examples of DBI and ZiBond processes and structures may be found throughout at least U.S. Pat. Nos. 9,391,143; 10,141,218; 10,147,641; 9,431,368; and 7,126,212, the entire contents of each of which are incorporated by reference herein in their entireties and for all purposes. Each of the singulated dies mounted on the carriers can be tested prior to mounting, such that all dies in the reconstituted wafer can be Known Good Dies (KGD).

Figures 1A, 1B, 1C:
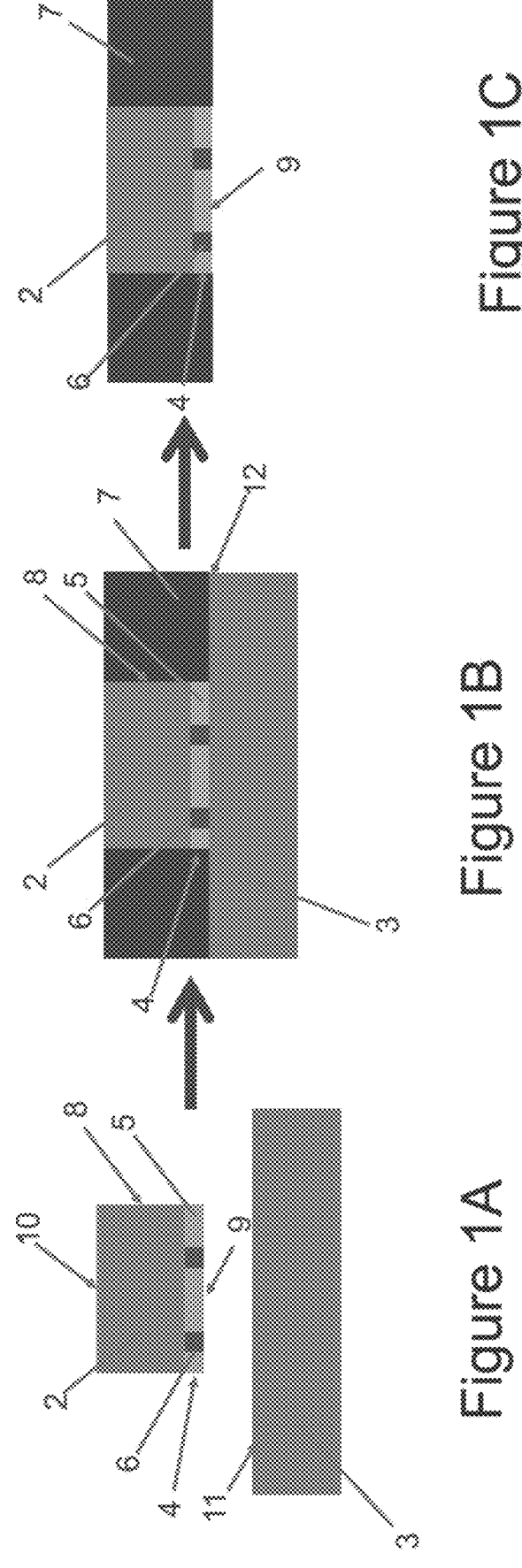
FIGS. 1A-1C schematically illustrates the use of a sacrificial carrier in various direct bonding processes.

FIGS. 1A-1C schematically illustrate the use of a sacrificial carrier 3 in various direct bonding processes. As shown, in some embodiments, an element 2 can be directly bonded to a carrier 3 without an adhesive. Throughout this application, the element 2 (or any of the other elements described herein) can comprise any suitable type of element, such as a semiconductor element (e.g., an integrated device die), an optical element, etc. The carrier 3 can comprise any suitable type of carrier, such as a carrier with one or more logic or processing devices, and/or a sacrificial carrier (e.g., a carrier without active processing circuitry) that is to be removed at some point during processing.

The element 2 can comprise a front side 9 and a back side 10 opposite the front side 9. In various embodiments, the front side 9 can comprise a surface nearest to active circuitry or devices formed in the element 2. A first front bonding layer 4 can be provided at the front side 9 of the element 2. Although the bonding layer 4 is shown at the front side 9 of the element 2, a bonding layer may also or alternatively be provided on the back side 10 for bonding. The bonding layer 4 can comprise one or a plurality of contact pads 6 disposed within or surrounded by a nonconductive field region 5. In some embodiments, the contact pads can comprise copper, although other conductive materials are suitable. In some embodiments, the nonconductive field region can comprise a dielectric such as silicon oxide, silicon nitride, etc. The back side 10 may or may not include active circuitry or devices. In various embodiments, the element 2 can comprise a singulated element (such as a singulated device die) having a side surface 8. The side surface 8 can comprise markings indicative of a singulation process, for example, saw markings, etch patterns, etc.

As explained above, and as shown in FIG. 1A, the element 2 (e.g., a die) can be directly bonded to the carrier 3 without an intervening adhesive along a bond interface 12. The front bonding layer 4 can be prepared for bonding, as explained above. For example, the front bonding layer 4 can be polished to a very low surface roughness and processed so as to enhance dielectric-to-dielectric direct bonding. In some embodiments, the surfaces to be bonded may be terminated with a suitable species and activated prior to bonding. For example, in some embodiments, the surfaces to be bonded may be very lightly etched for activation and exposed to a nitrogen-containing solution and terminated with a nitrogen-containing species. As one example, the surfaces to be bonded may be exposed to an ammonia dip after a very slight etch, and/or a nitrogen-containing plasma (with or without a separate etch).

Once the surfaces are prepared, the nonconductive field region 5 of the element 2 can be brought into contact with corresponding nonconductive regions of the carrier 3. The interaction of the activated surfaces can cause the nonconductive region 5 of the element 2 to directly bond with the corresponding nonconductive regions of the carrier 3 without an intervening adhesive, without application of external pressure, without application of voltage, and at room temperature. In various embodiments, the bonding forces of the nonconductive regions can be covalent bonds that are greater than Van der Waals bonds. In some embodiments, only nonconductive field regions of the element 2 are directly bonded to corresponding nonconductive regions of the carrier 3. In other embodiments, however, contact pads 6 of the element 2 can be directly bonded to corresponding conductive contacts of the carrier 3, and the nonconductive region 5 can also be directly bonded to the nonconductive regions of the carrier 3. In such embodiments, direct bonding of the contacts can improve alignment of the element 2 relative to the carrier 3. In the embodiments disclosed herein, the use of direct bonding can reduce movement during assembly as compared to implementations that utilize an intervening adhesive.

As shown in FIG. 1B, a protective material 7 can be applied over at least a portion of the element 2, including about at least a periphery or side surface 8 of the element 2. In some embodiments, the protective material 7 can be deposited along the side surface 8 and over an upper surface of the carrier 3. The protective material 7 can comprise one or more protective layers, including one or more inorganic layers, such as silicon oxide, silicon nitride, polysilicon, amorphous silicon, a metal, etc.

As shown in FIG. 1C, the carrier 3 can be removed from the element 2 and the protective material 7 in any suitable manner. In the illustrated embodiment, the carrier 3 can comprise a silicon substrate or element with a nano oxide layer 11, which as used herein can include at least one of a native silicon oxide layer and a thermal silicon oxide layer. Each of the embodiments disclosed herein can utilize such a carrier with nano oxide layer 11. In some embodiments, in the carrier removal process the carrier 3 can be selectively etched using the silicon nano oxide layer 11 as an etch stop. In some embodiments, at least a portion of the nano oxide 11 layer can remain after removing the silicon base material of the carrier 3. In other embodiments, the entirety of the carrier 3 (e.g., the silicon base material and the nano oxide layer 11) can be removed. In embodiments that utilize a nano oxide layer 11, the element 2 can be planarized for bonding, but the carrier 3 may not be planarized prior to direct bonding. In other embodiments, both the element 2 and carrier 3 can be planarized for direct bonding. Direct bonding and subsequent removal of the carrier 3 as described herein can advantageously leave a planar surface for a reconstituted wafer for further processing as desired, including for additional direct bonding processes. In contrast, reconstituted wafers formed on sacrificial or temporary adhesive layers (e.g., tape or film) do not reliably provide planar surfaces and thus can lead to subsequent alignment issues, e.g., for subsequent direct bonding of dies for stacking. Such stacking with direct bonding could be by way of direct bonding individual second dies on a first reconstituted wafer, or simultaneously bonding multiple second dies in a second reconstituted wafer.

Beneficially, the embodiment of FIGS. 1A-1C can enable the reconstitution of wafers for direct bonding with improved alignment accuracy. For example, although only one element 2 or die is shown in FIGS. 1A-1C, it should be appreciated that an array of multiple dies can be provided, and as shown below. In other applications in which an adhesive is used to bond the elements 2 (e.g., dies) to the carrier 3, the elements 2 or dies may become misaligned relative to the carrier 3 due to movement or migration of the adhesive, for example, during or after heating or during placement for bonding. Such misalignments can result in misalignment for subsequently bonded structures and negatively affect the performance of the bonded structures. The embodiments disclosed herein can beneficially reduce misalignment by providing a direct bond interconnection with the carrier 3, which can serve to effectively fix the element 2 or die relative to the carrier 3 for subsequent processing, such as providing a protective material 7 (inorganic or organic) over the element 2, or any other suitable processing.

Figure 2:
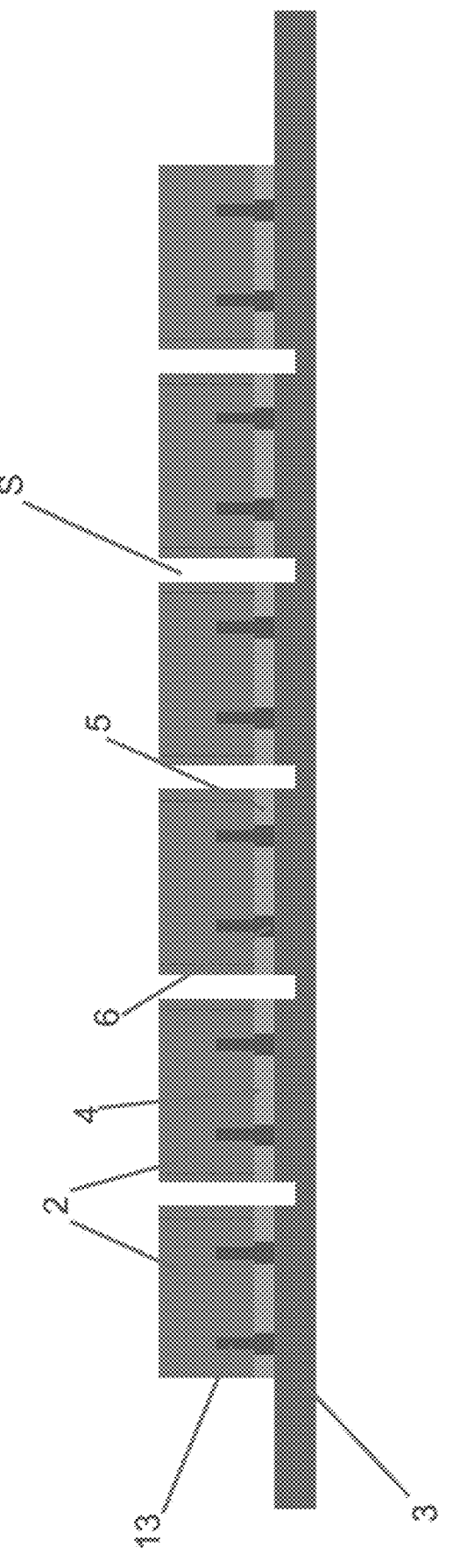
FIG. 2 illustrates a plurality of elements directly bonded to a carrier.

FIG. 2 illustrates a plurality of elements 2 directly bonded to a carrier 3, such as a wafer. Unless otherwise noted, reference numerals in FIG. 2 may represent components that are the same as or generally similar to like-numbered components of FIGS. 1A-1C. In FIG. 2, each element 2 can include one or more conductive vias 13 connected to back side(s) of corresponding contact pads 6. As shown in FIG. 2, the conductive vias may initially extend upwardly from the contact pad and terminate within the body of the element 2. After the directly bonding, the dies or elements 2 can be diced or singulated into a plurality of diced or singulated elements 2. As explained herein, the removal of a silicon substrate using the nano oxide layer 11 may leave a substantially smooth surface for subsequent direct bonding.

Figures 3A, 3B, 3C:
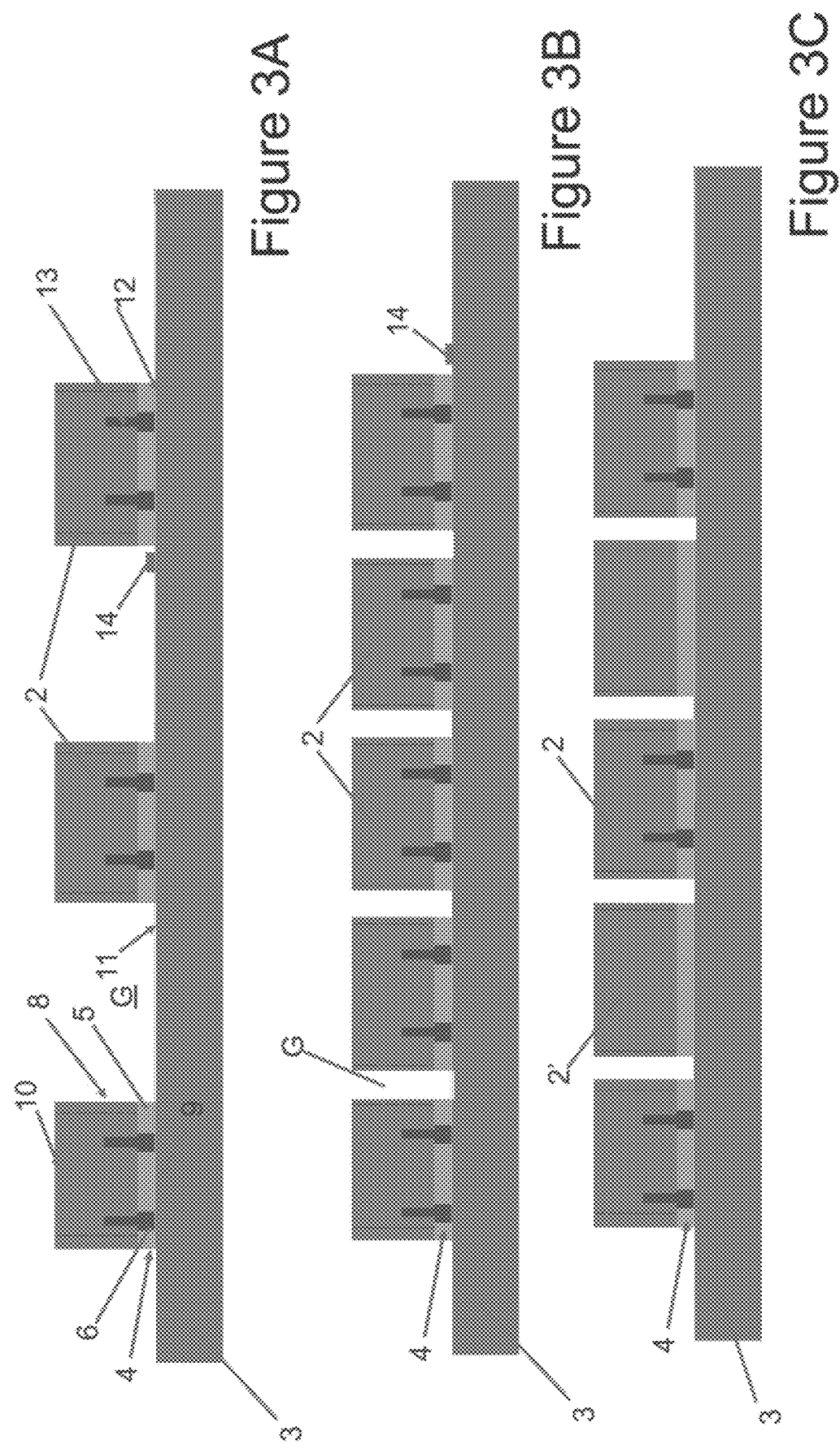
FIGS. 3A-3C show various examples in which elements are directly bonded to a carrier without an adhesive.

FIGS. 3A-3C show various examples in which elements 2 (e.g., integrated device dies) are directly bonded to a carrier 3 (e.g., a silicon substrate with nano oxide layer 11) without an intervening adhesive. FIG. 3A illustrates a relatively wide separation or gap G between elements 2, while FIG. 3B illustrates a relatively narrow separation or gap G between elements 2. FIG. 3C illustrates additional dummy elements 2' or dies disposed between active elements 2 or dies, with relatively narrow gaps G therebetween. Providing the narrow gaps G in FIGS. 3B and 3C can beneficially reduce the amount of protective material 7 used to fill the gaps G in subsequent steps and can enable conformal filling of the gaps G. Further, as shown in FIGS. 3A and 3B, one or more alignment feature(s) 14 can be provide on the upper surface of the carrier 3. The alignment features 14 can be selectively positioned on the carrier 3 to assist in accurate placement of the elements 2.

Figures 4A, 4B:
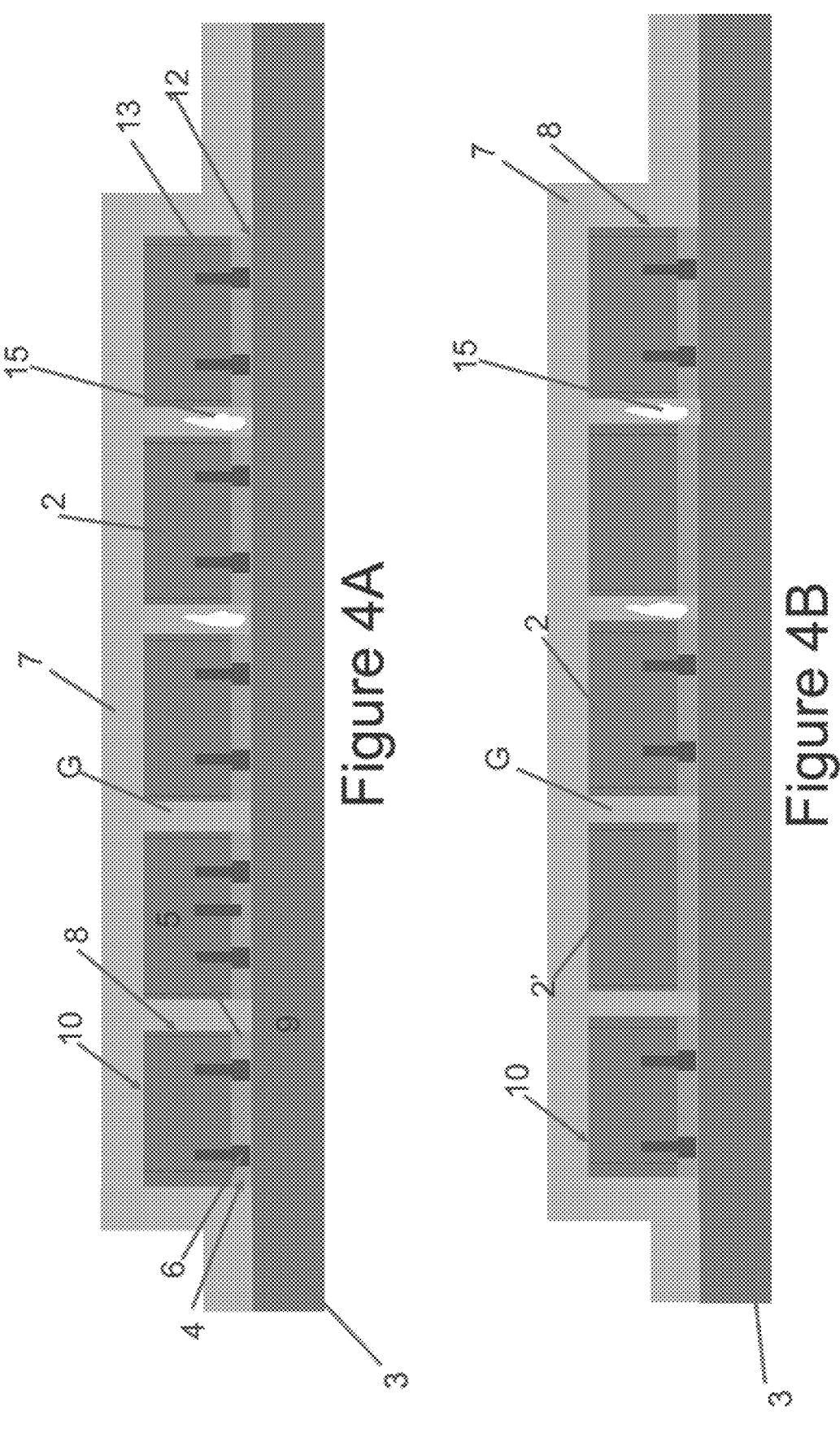
FIG. 4A is a schematic side view of a plurality of elements directly bonded to a carrier and with a protective material applied over the elements and within gaps between the elements.
FIG. 4B is a schematic side view of a plurality of elements that include one or more dummy elements directly bonded to a carrier.

FIG. 4A is a schematic side view of a plurality of elements 2 directly bonded to a carrier 3 and with a protective material 7 applied over the elements 2 and within the gaps G between the elements 2. In FIG. 4A, the elements 2 are illustrated as being all active integrated device dies. In FIG. 4B, some of the elements comprise dummy elements 2', such as inactive blocks of semiconductor material (e.g., silicon). In FIGS. 4A and 4B, a protective layer 7 (such as an inorganic protective layer) can be provided over portions of the elements 2, including around a portion of the periphery (e.g., the side surface 8) within the gaps G and over upper surfaces (which are the back sides 10 in FIGS. 4A-4B) of the elements 2. Seams 15 such as voids or discontinuities may be present in the protective material 7.

The protective layer 7 can include one or a plurality of protective layers, including, e.g., inorganic or organic protective layer(s). In the illustrated embodiment, for example, the protective layer 7 can comprise inorganic layer(s) such as silicon oxide, silicon nitride, polysilicon, amorphous silicon, or a metal. In other embodiments, at least a portion of the protective material 7 can comprise an organic material, such as a molding compound or epoxy. In some embodiments, the protective material 7 comprises both a conformal layer and a gap-fill layer. Beneficially, the protective material 7 can assist in affixing the elements 2 to the carrier 3 such that the elements 2 do not shift during subsequent direct bonding processes. The protective material 7 can also assist in protecting the elements 2 during polishing and other processing techniques to prevent damage to the dies (e.g., chipping). Examples of structures and processes for providing protective material 7 on and between adjacent directly bonded dies over a carrier, for use in conjunction with post-bonding thinning and/or singulation processes, are disclosed in U.S. Pat. No. 10,204,893, the entire contents of which are hereby incorporated by reference herein in their entirety and for all purposes.

Figures 5A, 5B, 5C:
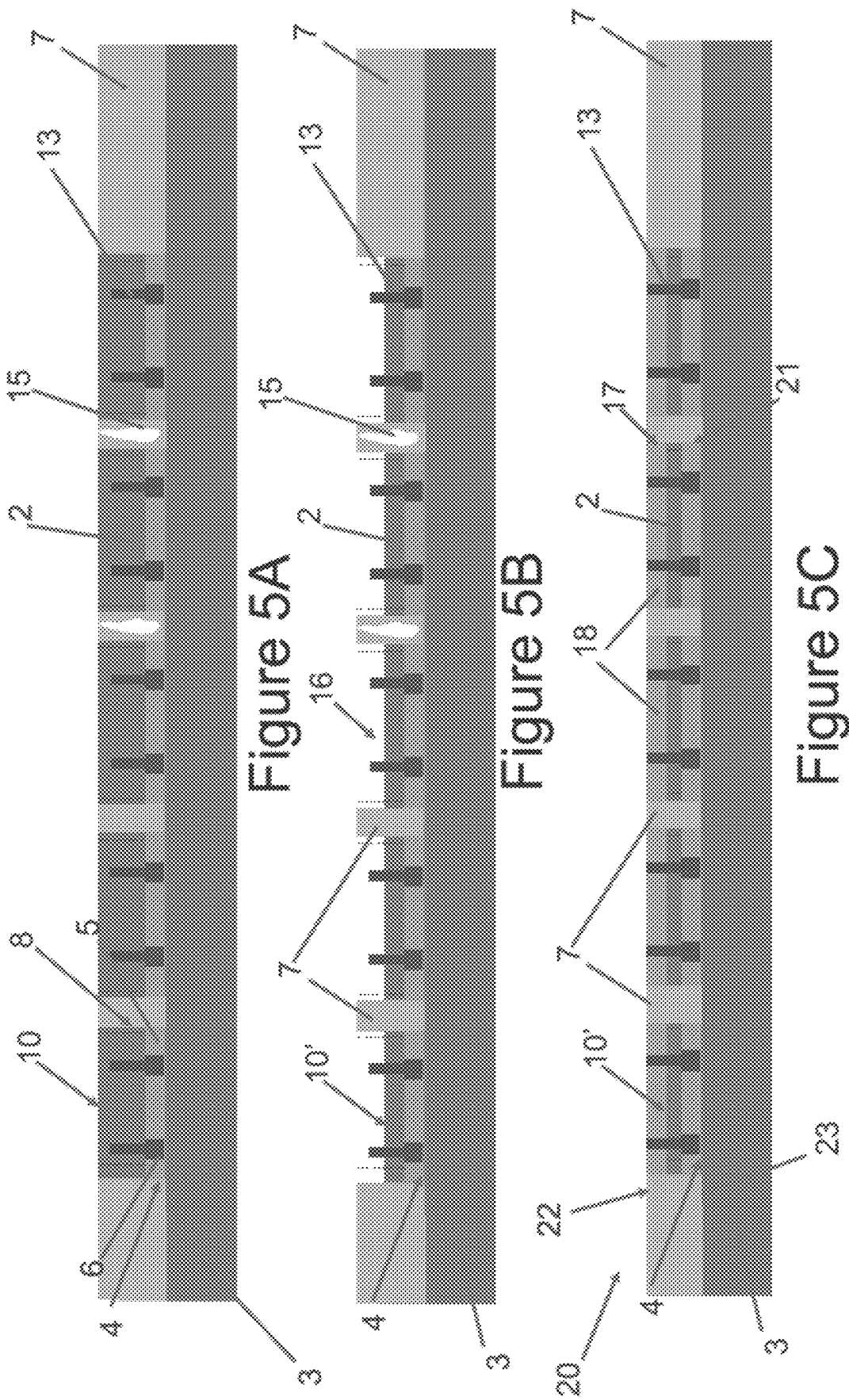
FIGS. 5A-5C illustrate a series of processing steps for forming a reconstituted wafer.

FIGS. 5A-5C illustrate a series of processing steps for forming a reconstituted wafer 20. The reconstituted wafer 20 can be bonded (e.g., directly bonded) to another reconstituted wafer 20 or to other substrates in subsequent steps. In FIG. 5A, the upper surfaces of the conformal protective material 7 can be removed, e.g., by etching, lapping, grinding, polishing, etc. In some embodiments, the removal of the protective material 7 can also remove a portion of the back side 10 of the elements 2. In other embodiments, the removal step can terminate at the back side 10 of the element 2.

Turning to FIG. 5B, a portion of the element 2 from the back side 10 can be removed by etching, lapping, chemical mechanical polishing (CMP), or any other suitable method, to form a thinned back side 10' of the element 2. As shown in FIG. 5A, this removal step can expose the conductive through substrate vias (TSVs) 13 or other electrical interconnects formed within the elements. The removal step can also form a cavity 16 defined at least in part by the thinned back side 10' of the element 2 and side walls of the protective material 7. In FIG. 5C, a nonconductive layer 18 (e.g., a second oxide layer) can be provided (e.g., deposited) over the thinned back sides 10' of the elements 2 and around the exposed vias 13. In some embodiments, the provided nonconductive layer 18 (for example, silicon oxide) can be lapped or polished to generate a planar surface and to ensure that the nonconductive layer 18 is generally planar relative to the exposed ends of the vias 13 and the protective material.

In FIG. 5C, the reconstituted wafer 20 can comprise a front surface 22 configured to be bonded (e.g., direct bonded) to another reconstituted wafer or other type of substrate. The reconstituted wafer 20 can also comprise a back surface 23. In the reconstituted wafer 20 of FIG. 5C, the protective material 7 can be disposed between adjacent elements 2 and can extend from the front surface 22 of the reconstituted wafer 20 to the upper surface of the carrier 3. A vertical interface 19 can be defined between the nonconductive layer 18 over the element 2 and the protective material 7. Similarly, a vertical interface 21 can be defined between the bonding layer 4 and the protective material 7.

Figure 6:
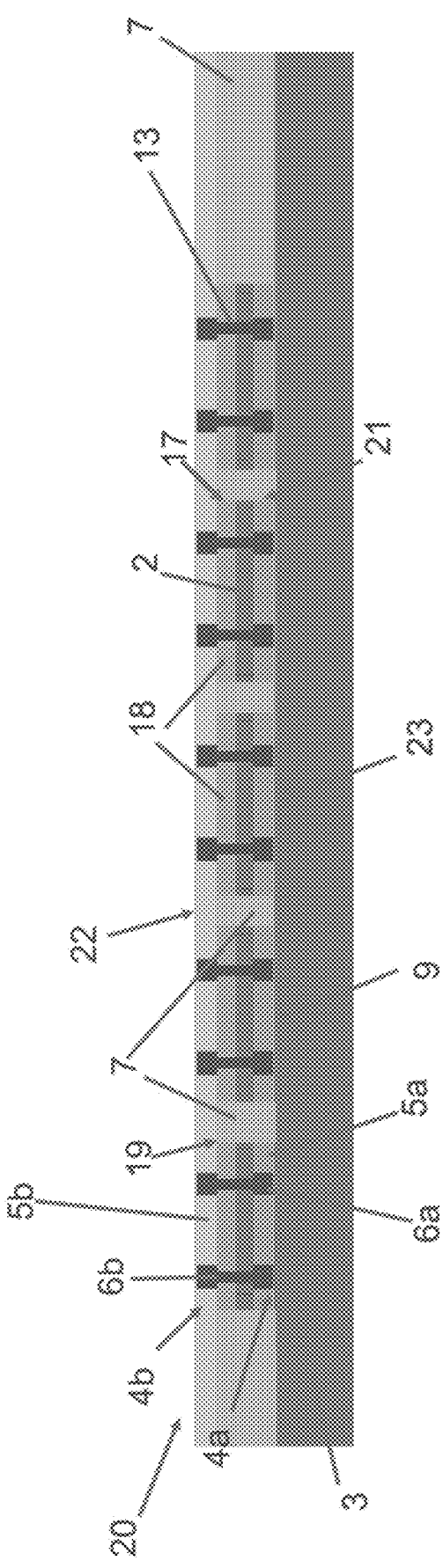
FIG. 6 is a schematic side sectional view of a reconstituted wafer having a bonding layer configured to directly bond to another reconstituted wafer or substrate.

FIG. 6 is a schematic side sectional view of a reconstituted wafer having a second bonding layer 4b configured to directly bond to another reconstituted wafer or substrate. The first bonding layer 4, the contacts 6, and the nonconductive field region 5 of FIGS. 1A-5 have been renumbered as reference numerals 4a, 6a, and 5a, respectively, in FIG. 6. As shown in FIG. 6, in some embodiments, the second bonding layer 4b, e.g., a DBI layer having alternating conductive contacts 6b and nonconductive bonding portions (e.g., field regions 5b), can be provided over the nonconductive layer 18 (e.g., a second oxide layer) to facilitate additional bonding connections, if desired, to provide bonding pads conducive to DBI alignment. Thus, in FIG. 6, the second bonding layer 4b can extend across multiple (e.g., all) of the elements 2 of the reconstituted wafer 20. A horizontal interface 19 can be formed between the second bonding layer 4b and the nonconductive layer 18, and between the second bonding layer 4b and the underlying protective material 7.

Figures 7A, 7B:
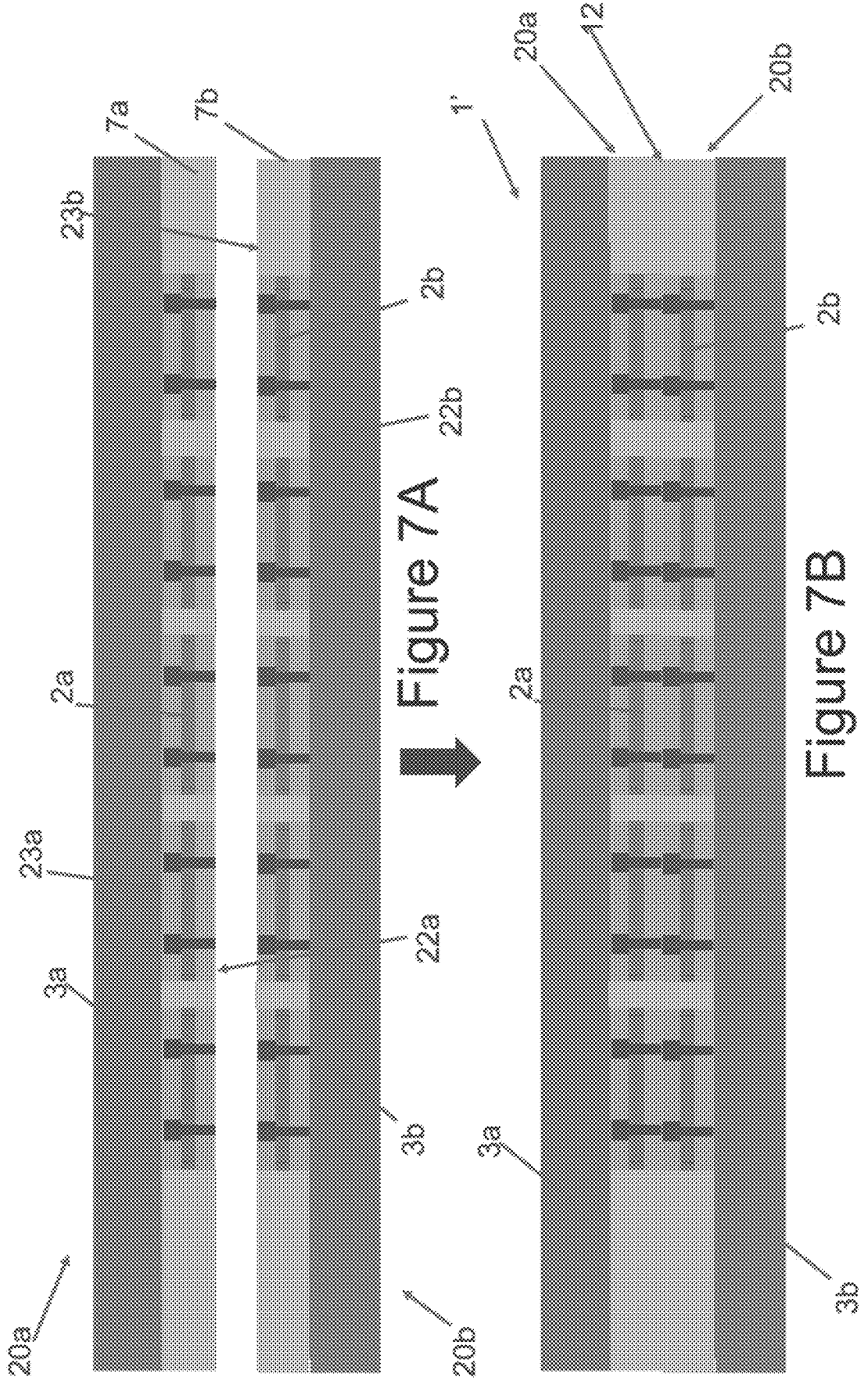
FIG. 7A illustrates two opposing reconstituted wafers prior to direct bonding.
FIG. 7B illustrates the two opposing reconstituted wafers after being directly bonded to one another.

In FIGS. 7A-7B, two opposing reconstituted wafers 20a, 20b can be provided and can be directly bonded to form a pair of bonded reconstituted wafers 1'. The reference numerals have been appended with "a" or "b" to denote their respective associations with the reconstituted wafers 20a or 20b. FIG. 7A illustrates the two opposing reconstituted wafers 20a, 20b prior to direct bonding. FIG. 7B illustrates the two opposing reconstituted wafers 20a, 20b after being directly bonded to one another. Use of direct bonding on the carriers 3a, 3b provides the planarity desired at the die bonding surfaces for die-to-die direct bonding of conductive and non-conductive surfaces. In other embodiments, however, the carriers may not be used and instead the reconstituted wafers may comprise elements (e.g., dies) at least partially embedded in a molding compound or encapsulant without the use of a carrier. In FIG. 7B, the nonconductive protective layers can be directly bonded to one another without an adhesive along the bond interface 12. Other non-conductive field regions of the reconstituted wafers 20a, 20b (such as nonconductive field regions 5a, 5b of bonding layers 4a, 4b, the nonconductive layer(s) 8, etc.) can also be bonded to one another by an adhesive. Moreover, the conductive contacts 6a, 6b can be directly bonded without an adhesive. In some embodiments, some or all of the conductive contacts 6a, 6b can be initially recessed relative to the bonding surfaces. The bonded wafers 20a, 20b can be heated to cause the contacts 6a, 6b to expand and form an electrical contact. After heating, the interface between the contacts 6a and 6b may not be in the same plane as the bond interface 12.

Figures 8A, 8B:
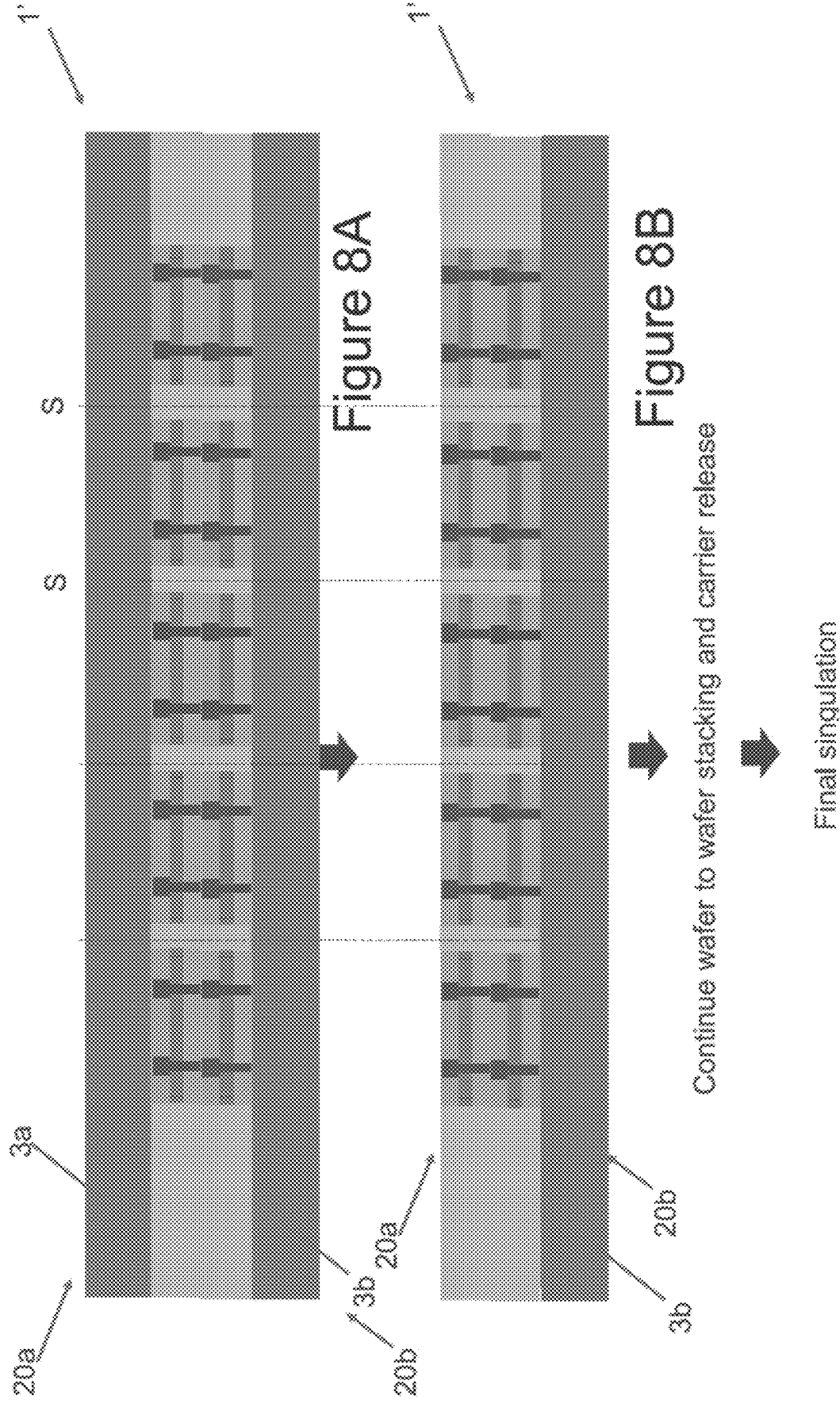
FIG. 8A-8B illustrate methods and structures for stacking more than two reconstituted wafers, according to various embodiments.

Additional reconstituted wafers 20a, 20b can be provided as shown in FIGS. 8A-8B to provide any number of stacked reconstituted wafers 1'. The stacked reconstituted wafers 1' can be singulated along singulation streets S to provide a plurality of bonded structures 1. Any suitable number of reconstituted wafers 20a, 20b can be provided to form the stacked reconstituted wafers 1', which can also be singulated to form any suitable number of bonded structures 1. The singulation can be before removal of the carriers 3 as shown (if sacrificial), or after singulation. In some embodiments, as shown in FIG. 8A, both carriers 3a, 3b may not be removed prior to singulation. In some embodiments, as shown in FIG. 8B, one carrier 3a can be removed prior to singulation. In other embodiments, both carriers 3a, 3b can be removed prior to singulation. As explained herein, removal of the carriers 3a and/or 3b using, for example, an etch process, may leave behind a nano oxide layer 11 to facilitate additional direct bonding.

FIGS. 9A-9F and 10A-10E illustrate various face up or face down bonded structures 1 that can result from the methods described herein. The bonded structures 1 shown in FIGS. 9A-9F and 10A-10E can comprise singulated reconstituted elements 24, such as singulated reconstituted integrated device dies. The singulated reconstituted elements 24 are shown in FIGS. 9A, 9E and 9F for illustrative purposes to show what structures may result from a singulated reconstituted wafer 20, according to various embodiments. As shown in FIGS. 9A-9F and 10A-10E, the surfaces nearest to active circuitry or devices can be the front surfaces 22 of the bonded structures 1, while the surfaces opposite the front surfaces 22 can be the back surfaces 23. Unlike individually picked and placed dies or elements, the directly bonded reconstituted elements 24 of the illustrated embodiments can have coplanar side surfaces as well as a direct bonding interface 12 between conductive (e.g., metal) and nonconductive (e.g., inorganic dielectrics such as oxides, including nitrogen and/or fluorine content to aid direct bonding) surfaces of the reconstituted elements 24, with no intervening adhesives.

FIGS. 9A-9F illustrate examples of face down bonded structures. Turning to FIG. 9A, the singulated reconstituted element 24 can comprise the element 2, the nonconductive layer 18 disposed on the thinned back side 10' of the element 2, and bonding layers 4a, 4b at the front and back surfaces 22, 23, respectively. As shown in FIG. 9A, the protective material 7 can extend from the back side 23 to the front side 22 of the reconstituted element 24. Thus, in the embodiment of FIG. 9A, the singulated reconstituted element 24 can have a sidewall 25 defined by the outer exposed surface of the protective material. A vertical interface 26 can be defined between the protective material 7 and the element 2, the nonconductive layer 8, and the first and second bonding layers 4a, 4b. In the arrangement of FIG. 9A, the protective material 7 accordingly abuts the bonding layers 4a, 4b, which may be applied before the protective material 7 is provided. In other embodiments, as explained in connection with FIG. 6, one or more of the bonding layers 4a, 4b can extend over the protective material 7 such that the sidewall 25 includes the protective material 7 and a side edge of the bonding layers 4a and/or 4b.

FIG. 9B illustrates a front-to-back bonding arrangement in which the front surface 22a of the reconstituted element 24a is directly bonded to the back surface 23b of the reconstituted element 24b without an intervening adhesive to form the bonded structure 1. In FIG. 9B, a first portion 7a of protective material can extend from the back surface 23a of the reconstituted element 24a to the bonding interface 12. A second portion 7b of protective material can extend from the bonding interface 12 to the front surface 22b of the reconstituted element 24b.

FIG. 9C illustrates a front-to-front bonding arrangement in which the front surface 22a of the reconstituted element 24a is directly bonded to the front surface 23a of the reconstituted element 24b without an intervening adhesive to form the bonded structure 1. In FIG. 9C, the first portion 7a of protective material can extend from the back surface 23a of the reconstituted element 24a to the bonding interface 12. The second portion 7b of protective material can extend from the bonding interface 12 to the back surface 23b of the reconstituted element 24b.

FIG. 9D illustrates a back-to-back bonding arrangement in which the back surface 23a of the reconstituted element 24a is directly bonded to the back surface 23b of the reconstituted element 24b without an intervening adhesive to form the bonded structure 1. In FIG. 9D, the first portion 7a of protective material can extend from the front surface 22a of the reconstituted element 24a to the bonding interface 12. The second portion 7b of protective material can extend from the bonding interface 12 to the front surface 22b of the reconstituted element 24b.

FIGS. 9E and 9F illustrate additional examples of singulated reconstituted elements 24 that utilize a second protective layer 40. Additional details regarding methods of forming the reconstituted element 24 of FIGS. 9E and 9F may be found below in, for example, FIGS. 11-12C. In the embodiment of FIG. 9E, for example, the second protective material can be applied over the protective material 7. In FIG. 9E, the second protective material may be exposed at the back surface 23 of the reconstituted element 24 adjacent the bonding layer 4b. Further, the protective material 7 can be exposed at the front surface 22 adjacent the bonding layer 4a and underlying the second protective layer 40. Thus, in FIG. 9E, the sidewall 25 can include a horizontal interface 42 between the first and second protective materials 7, 25. Moreover, at the back surface 23, a vertical interface 41 can be provided between the first and second protective materials 7, 25.

In the embodiment of FIG. 9F the second protective material 40 can also be applied over the protective material 7. However, unlike the embodiment of FIG. 9E, in FIG. 9F, a third protective layer 43 can be provided over the second protective material 40. The third protective layer 43 may be exposed at the back surface 23 of the reconstituted element 24. Thus, in FIG. 9F, a vertical interface 45 can be provided between the protective material 7 and the third protective material 43. A horizontal interface 46 can be provided between the second protective material 40 and the third protective material 43.

Figures 10A, 10B, 10C, 10D, 10E:
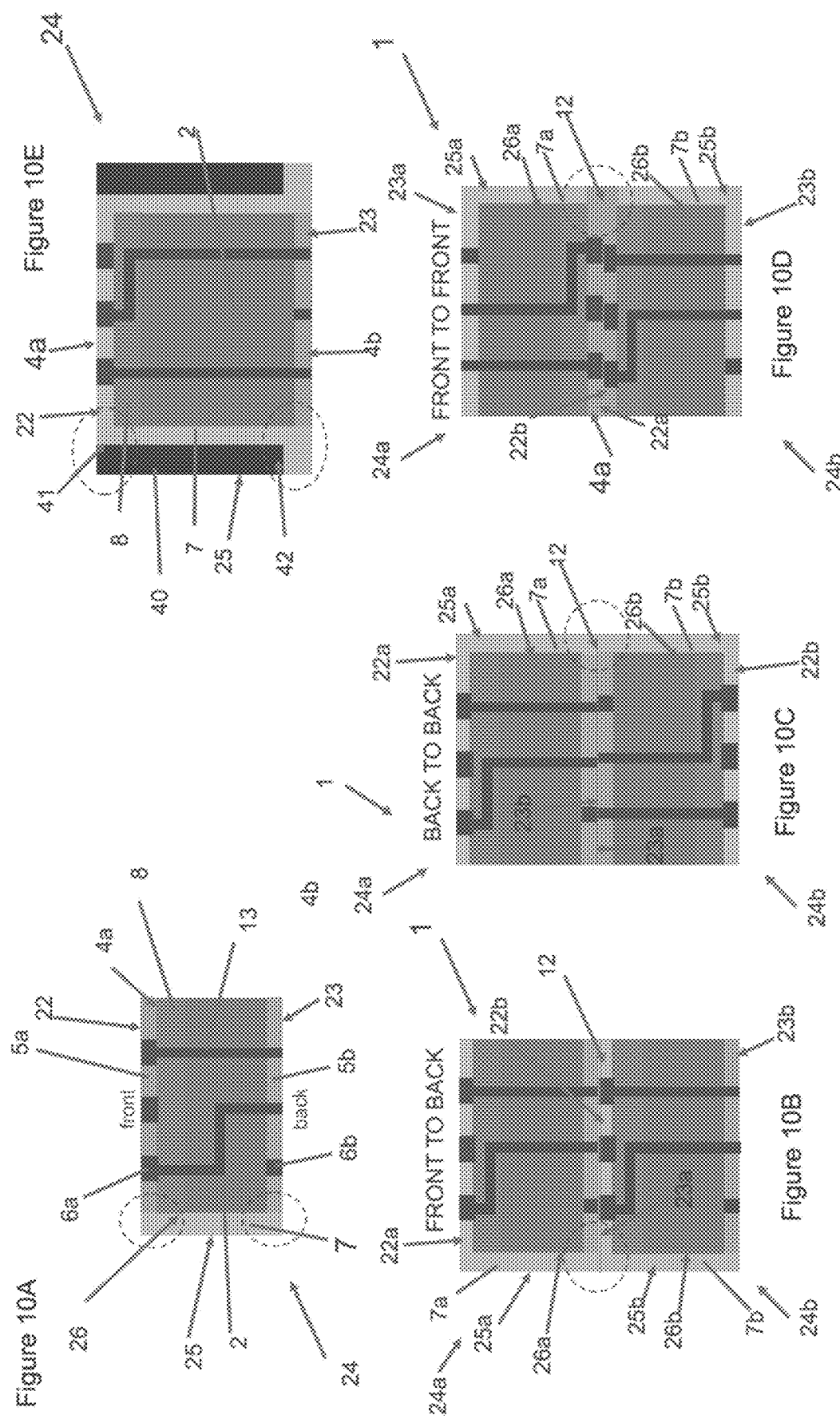
FIGS. 10A-10E illustrate various face down bonded structures, according to various embodiments.

FIGS. 10A-10E illustrate examples of face up bonded structures 1. Unless otherwise noted, reference numerals in FIGS. 10A-10E may refer to the same or generally similar components as reference numerals in FIGS. 9A-9F. Turning to FIG. 10A, a singulated reconstituted element 24 is shown in a face up orientation. In FIGS. 10B-10D, respective reconstituted elements 24a, 24b are directly bonded to one another to form bonded structures.

As with FIG. 9B, FIG. 10B illustrates a front-to-back bonding arrangement in which the front surface 22a of the reconstituted element 24a is directly bonded to the back surface 23b of the reconstituted element 24b without an intervening adhesive to form the bonded structure 1. In FIG. 10B, a first portion 7a of protective material can extend from the back surface 23a of the reconstituted element 24a to the bonding interface 12. A second portion 7b of protective material can extend from the bonding interface 12 to the front surface 22b of the reconstituted element 24b.

FIG. 10C illustrates a back-to-back bonding arrangement in which the back surface 23a of the reconstituted element 24a is directly bonded to the back surface 23b of the reconstituted element 24b without an intervening adhesive to form the bonded structure 1. In FIG. 10C, the first portion 7a of protective material can extend from the front surface 22a of the reconstituted element 24a to the bonding interface 12. The second portion 7b of protective material can extend from the bonding interface 12 to the front surface 22b of the reconstituted element 24b.

FIG. 10D illustrates a front-to-front bonding arrangement in which the front surface 22a of the reconstituted element 24a is directly bonded to the front surface 22b of the reconstituted element 24b without an intervening adhesive to form the bonded structure 1. In FIG. 10D, the first portion 7a of protective material can extend from the back surface 23a of the reconstituted element 24a to the bonding interface 12. The second portion 7b of protective material can extend from the bonding interface 12 to the back surface 23b of the reconstituted element 24b. In FIG. 10D, the bonding layers 4a can extend over the protective material 7a, 7b and can be exposed on the sidewall 25. As explained above in connection with FIG. 6, in some embodiments, the bonding layer 4a can be provided across the wafer over the protective material 7 such that, when the reconstituted wafer is singulated, the bonding layer 4a is exposed at the sidewall and flush with the protective material 7 at the sidewall 25.

FIG. 10E illustrates a singulated reconstituted element 24 that has a second protective material 40 disposed over side and upper surfaces of the protective material 7. Unlike the embodiment of FIGS. 9E and 9F, in FIG. 10E, the first front bonding layer 4a can be coplanar or flush with the second protective material 40. The second back bonding layer 4b can be coplanar or flush with the protective material 7.

Figure 11:
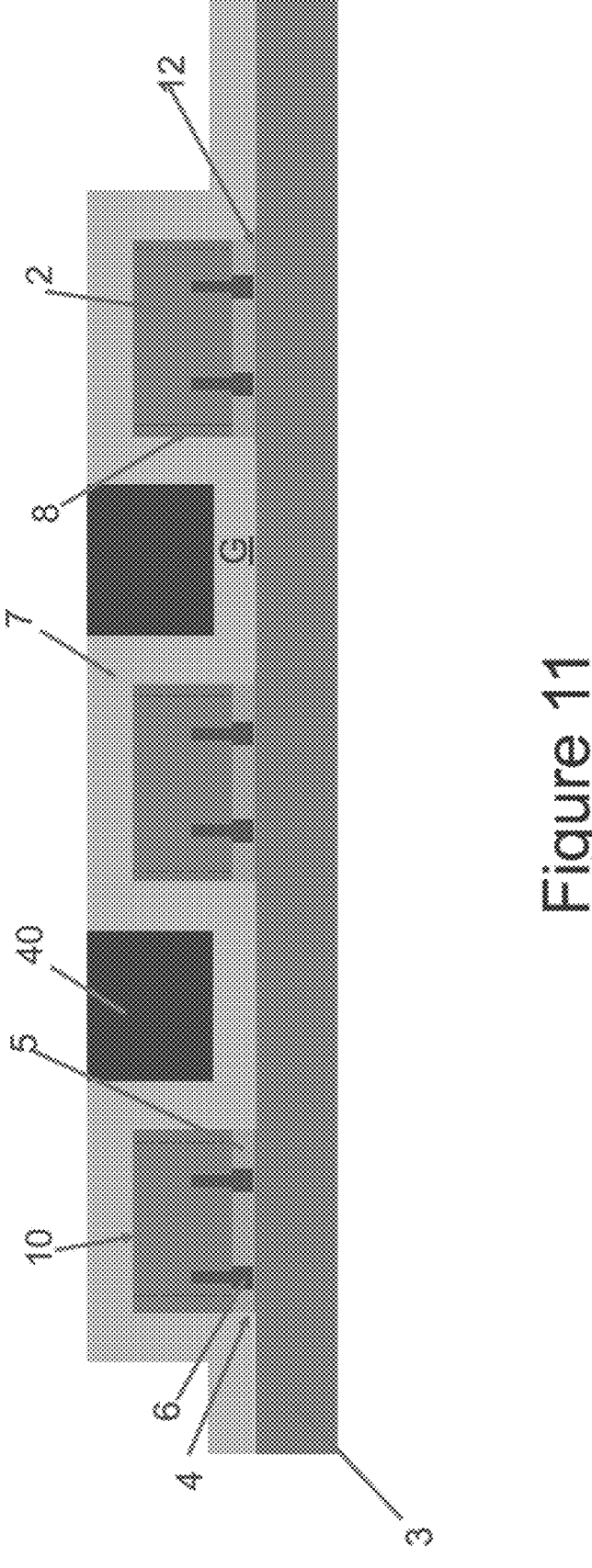
FIG. 11 illustrates another embodiment in which an additional filler material can serve as a second protective material and may be provided over a conformal protective material in the gaps between adjacent elements.

FIG. 11 illustrates another embodiment similar to those described above, except an additional filler material can serve as a second protective material 40 and may be provided over a conformal protective material 7 in the gaps G between adjacent elements 2. The protective material 7 can be deposited conformally over the back sides 10 and side surface 8 of the elements 2 and over the upper surface of the carrier 3. The conformal protective material 7 can have gaps G between portions of the protective material 7 disposed on the side surfaces 8 of the elements 2. The second protective material 40 can serve to fill the gaps G. The second filler protective material 40 can comprise any suitable material, including organic or inorganic materials.

Figures 12A, 12B, 12C:
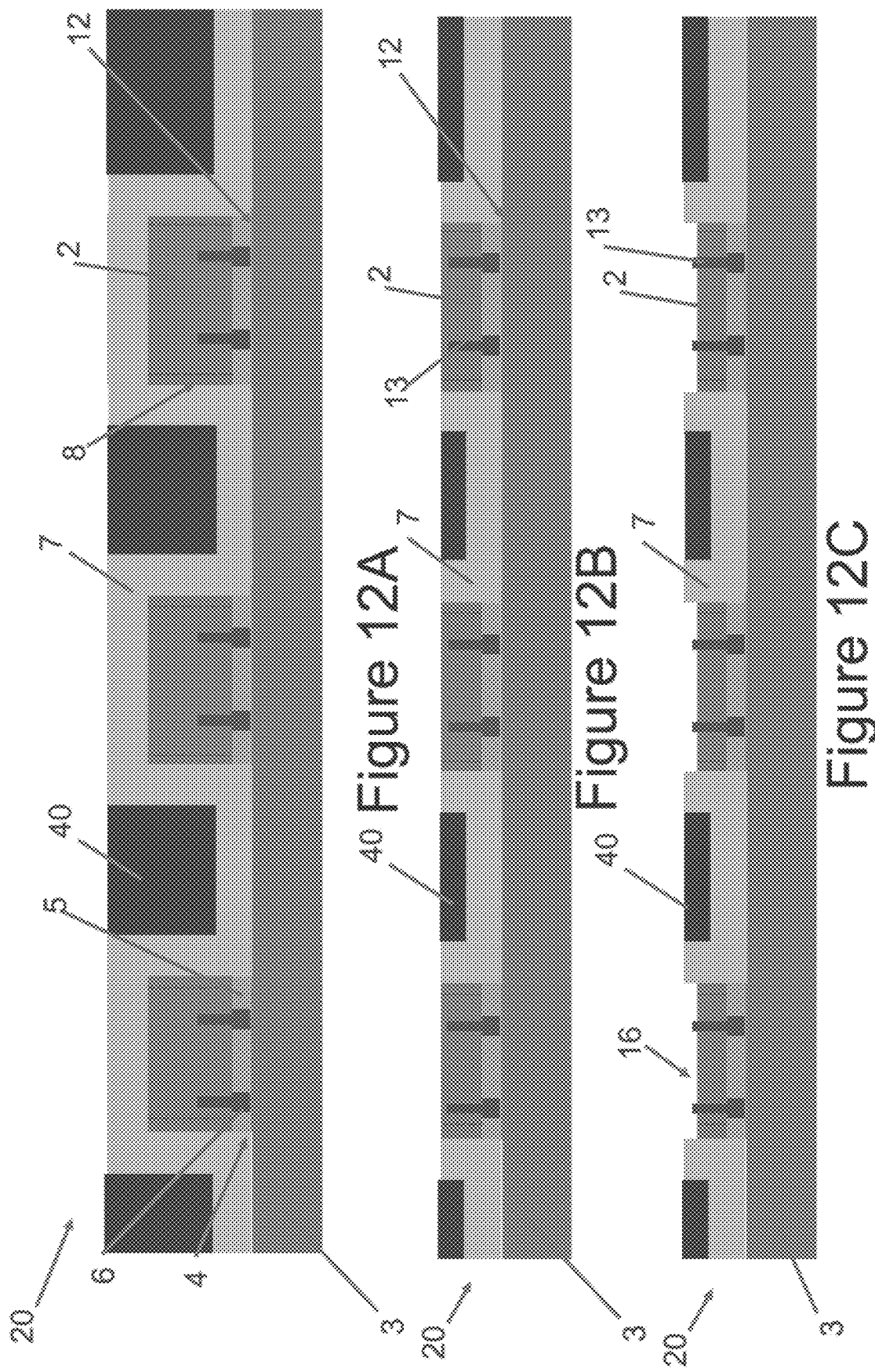
FIGS. 12A-12C illustrate a method for forming a reconstituted wafer according to various embodiments.

FIGS. 12A-12C illustrate a method for forming a reconstituted wafer 20 according to various embodiments. FIG. 12A is generally similar to FIG. 11, except additional portions of the second protective material 40 are provided on the ends of the outer elements 2. In FIG. 12B, a portion of the protective material 7 and a portion of the second filler protective material 40 can be removed to provide a generally planar surface. In various embodiments, for example, the respective portions of the filler and conformal protective materials 40, 7 can be removed by etching, lapping, grinding, chemical mechanical polishing (CMP), etc. In FIG. 12C, a portion of the bulk semiconductor material of the elements 2 or dies (e.g., silicon) can be removed to form a cavity 16, for example, by etching, lapping, CMP, etc., to expose the conductive vias 13. The conformal and/or gap-fill protective materials may have coefficient(s) of thermal expansion that is (are) within 5 ppm/° C. of a coefficient of thermal expansion of the elements 2 (e.g., integrated device dies).

Figures 13A, 13B:
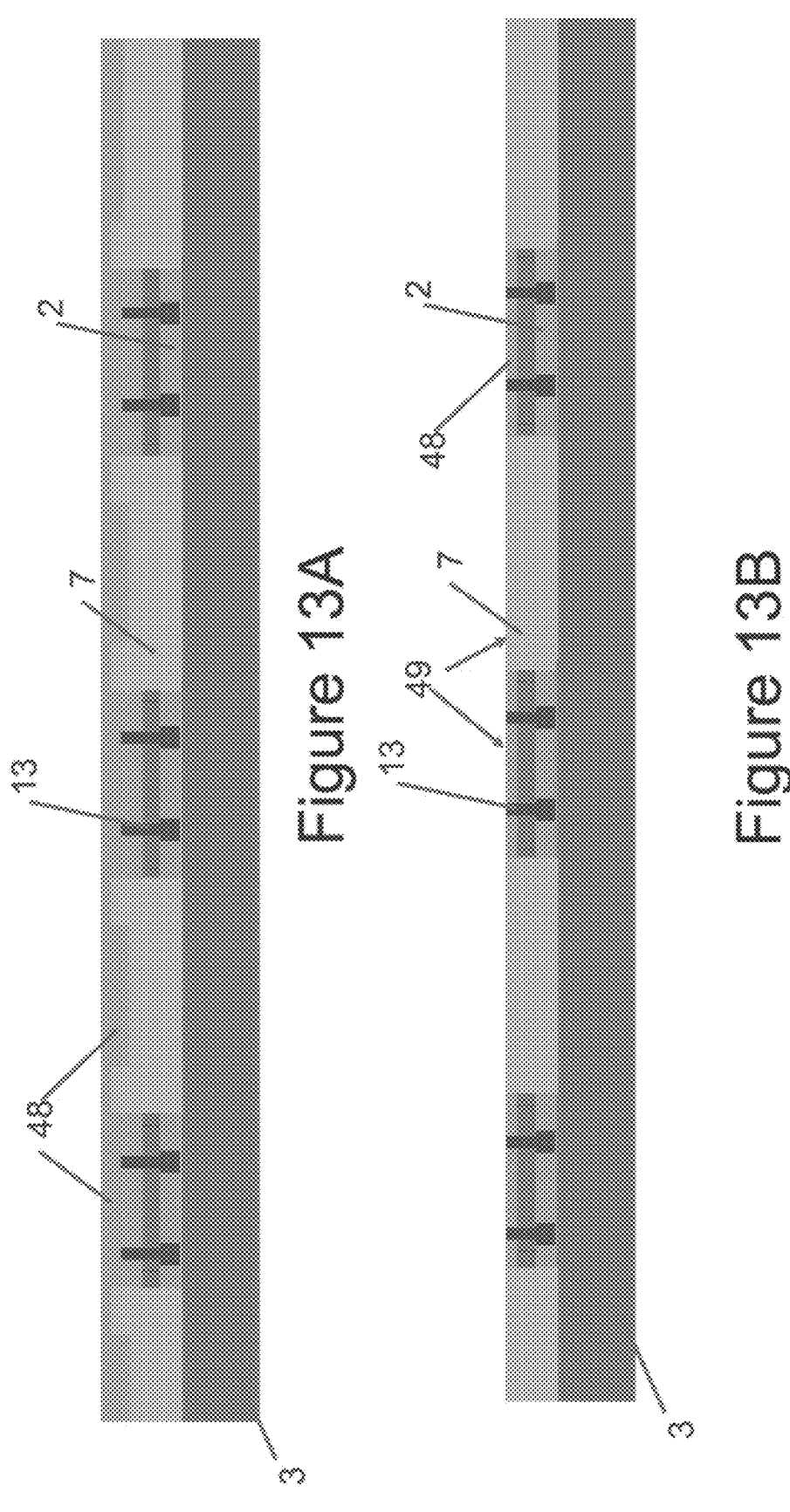
FIGS. 13A-13B illustrate a method for forming a reconstituted wafer according to various embodiments.

In FIG. 13A, the second filler protective material 40 can be removed from the structure shown in FIG. 12C, and an additional protective material 48 can be provided over the elements 2 and the exposed vias 13. In FIG. 13B, the provided additional protective material 48 and a portion of the protective material 7 can be removed or planarized to form a bonding surface 49 with the vias exposed on the upper surface.

Figures 14A, 14B, 14C:
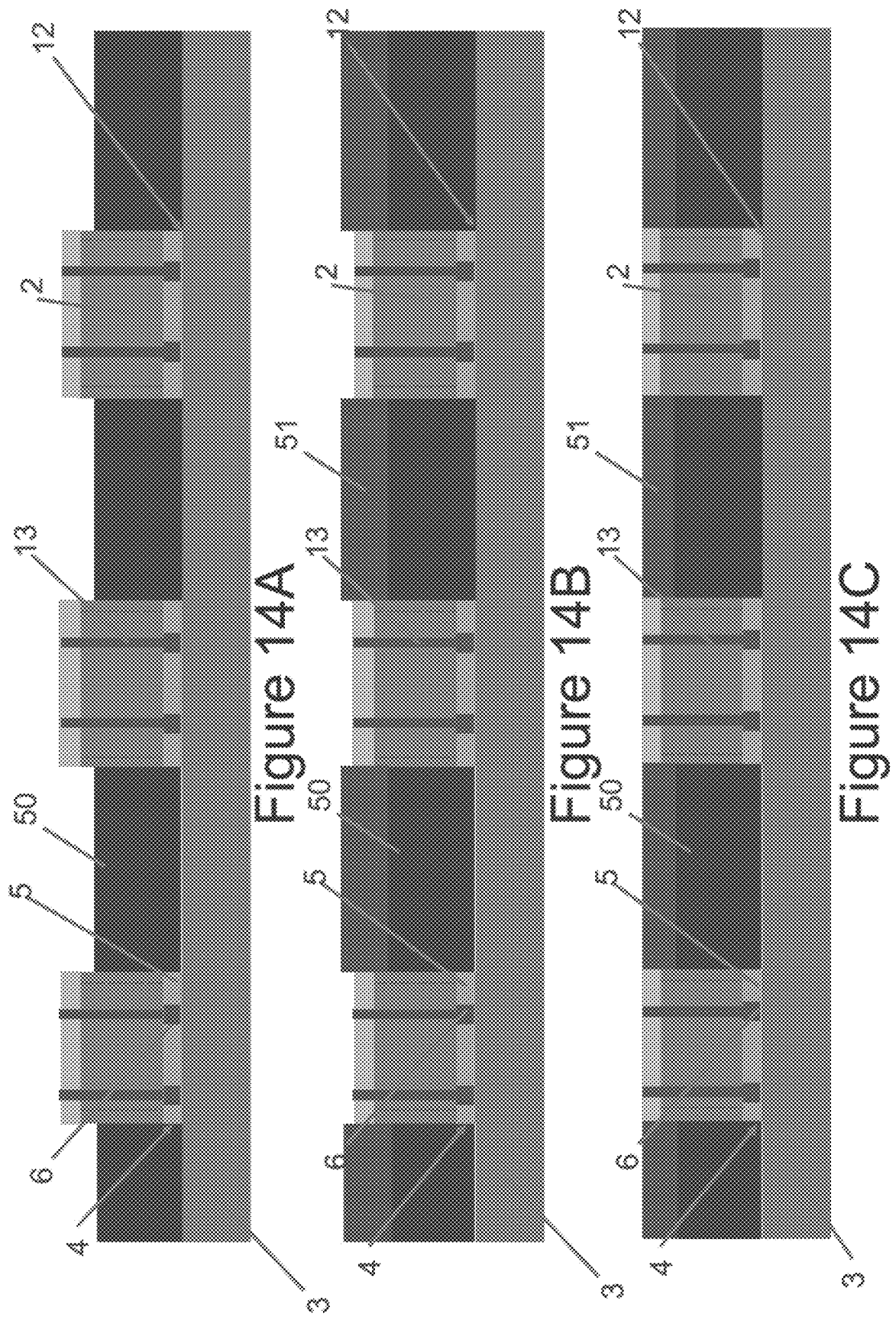
FIGS. 14A-14C illustrate another embodiment in which a mold compound can be provided between adjacent elements directly bonded to a carrier, and a metal can be provided on the mold compound.

FIGS. 14A-14C illustrate another embodiment in which a mold compound 50 can be provided between adjacent elements 2 directly bonded to a carrier 3 without an adhesive. In FIG. 14A, the vias 13 are shown as being exposed on the back side, but in other embodiments, the vias 13 can be buried as illustrated above. As shown in FIG. 14B, a metal 51 (such as copper) can be provided over the mold compound 51 as shown in FIG. 14B. For example, in various embodiments, the metal 51 can be provided using an electroless plating process, a sputtering process, or any other suitable method. As shown in FIG. 14C, the metal 51 can be planarized, for example, by chemical mechanical polishing (CMP), or any other suitable method. In some embodiments, structures that utilize an organic material for the mold compound may be challenging to planarize using CMP to sufficient smoothness (e.g., less than nm, etc.). By providing a metal 51 (such as copper) over the mold compound, CMP or other planarization processes can be used to planarize to sufficient smoothness for direct bonding.

Figures 15A, 15B, 15C:
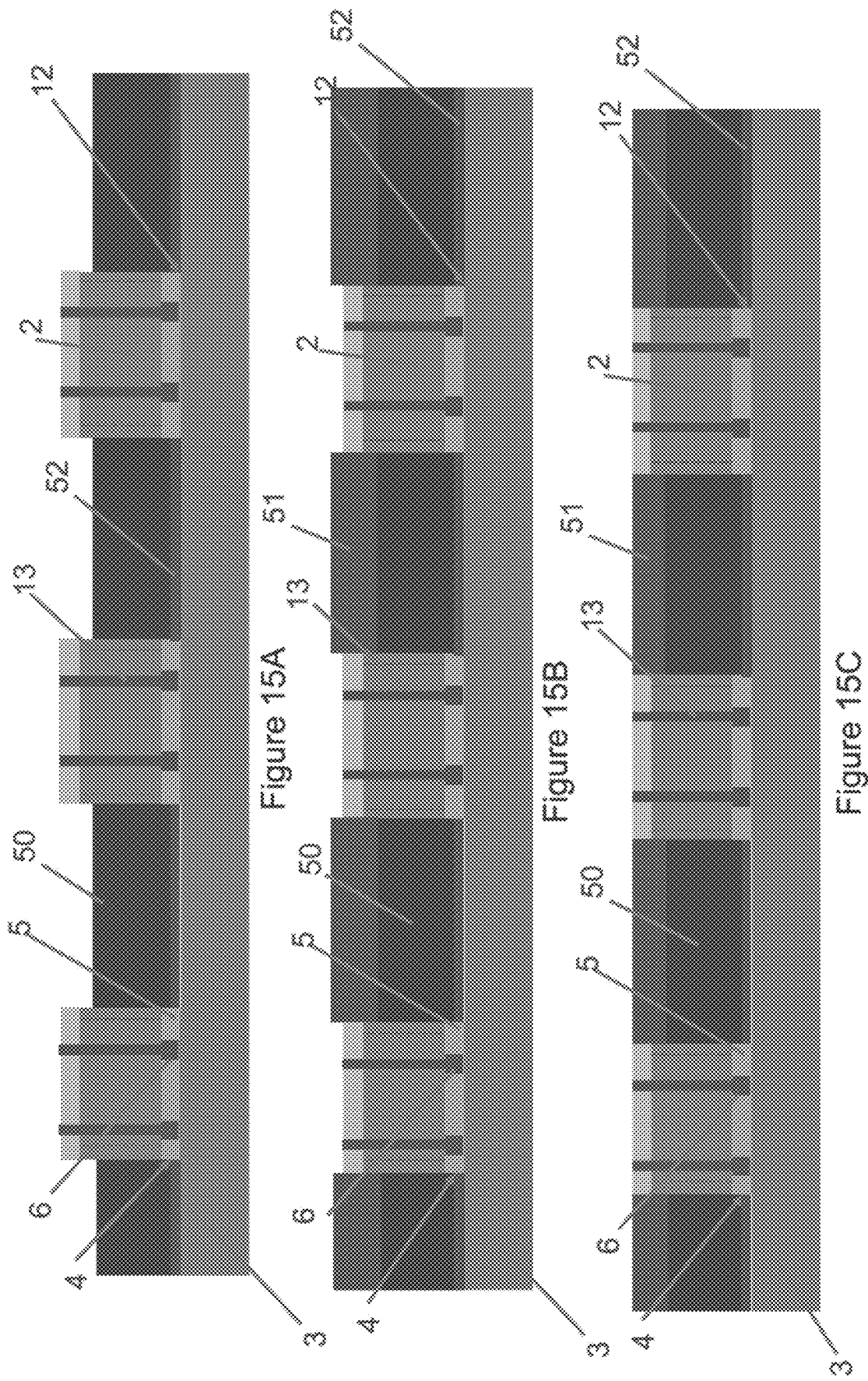
FIGS. 15A-15C illustrate another embodiment in which a mold compound can be provided between adjacent elements directly bonded to a carrier, and a metal can be provided on both sides of the mold compound.
Figures 16A, 16B, 16C:
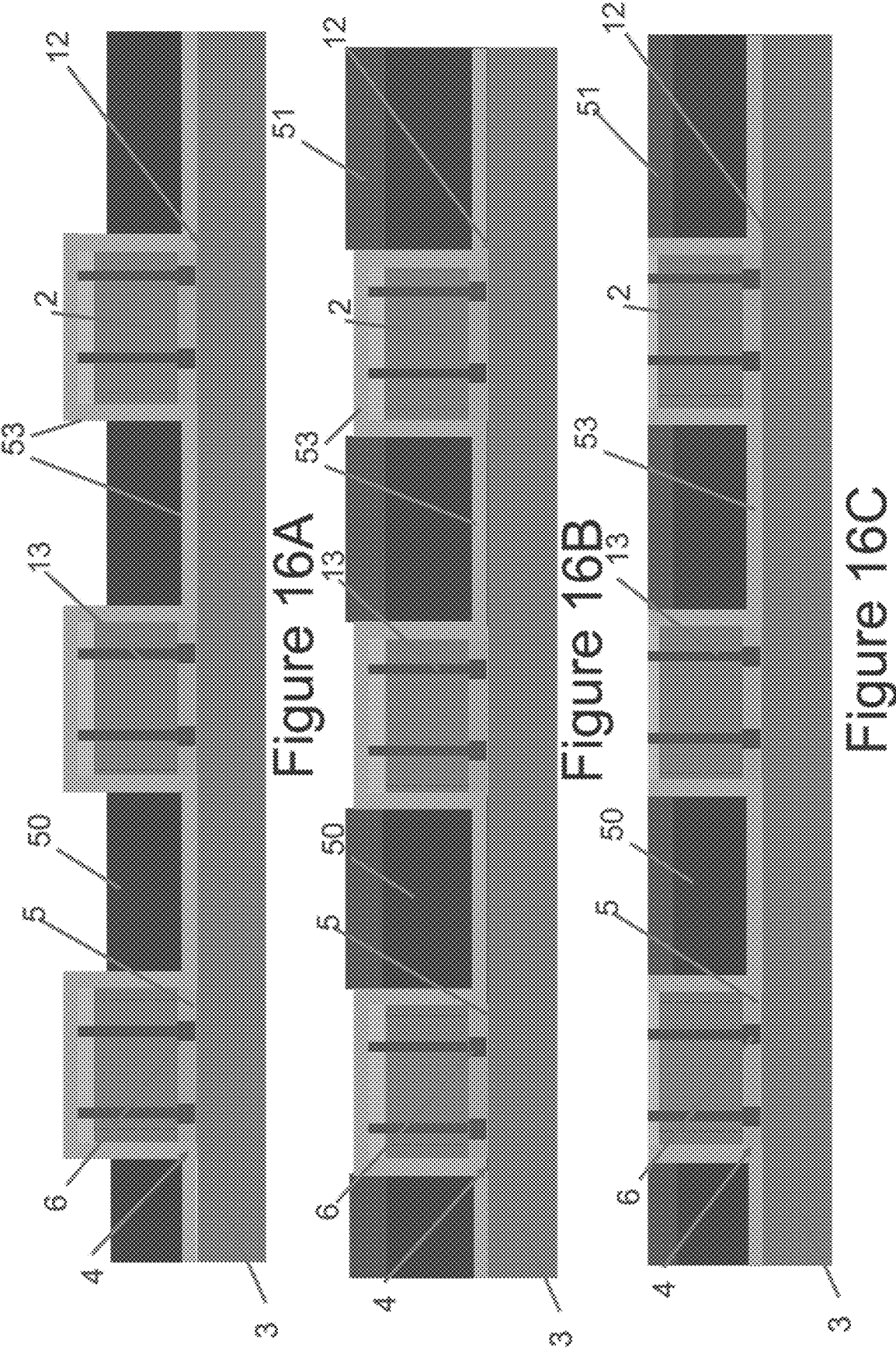
FIGS. 16A-16C illustrate another embodiment in which a protective coating or layer can be provided between the mold compound and the carrier.

FIGS. 15A-15C are generally similar to FIGS. 14A-14C, except in FIGS. 15A-15C, a second metal 52 can be provided over the carrier 3 between the carrier 3 and the mold compound 50. FIGS. 16A-16C illustrate another embodiment in which a protective coating 53 or layer (e.g., silicon oxide) can be provided between the mold compound and the carrier 3. A protective coating can also be provided after die placement and before metal deposition in various embodiments. In FIG. 16A, the protective coating 53 can conformally coat the upper surface of the carrier 3 and upper and side surfaces of the elements 3. The mold compound 50 can be provided over the protective coating 53 and between the elements 2. In FIG. 16B, the metal 51 can be provided over the mold compound 50 as explained above. In FIG. 16C, the portions of the protective coating 53 that overlie the elements 2 can be removed using a polishing, grinding, or lapping process to expose the vias 13. The metal 51 and element 2 can be planarized to form a smooth surface for bonding.

Figures 17A, 17B, 17C, 17D:
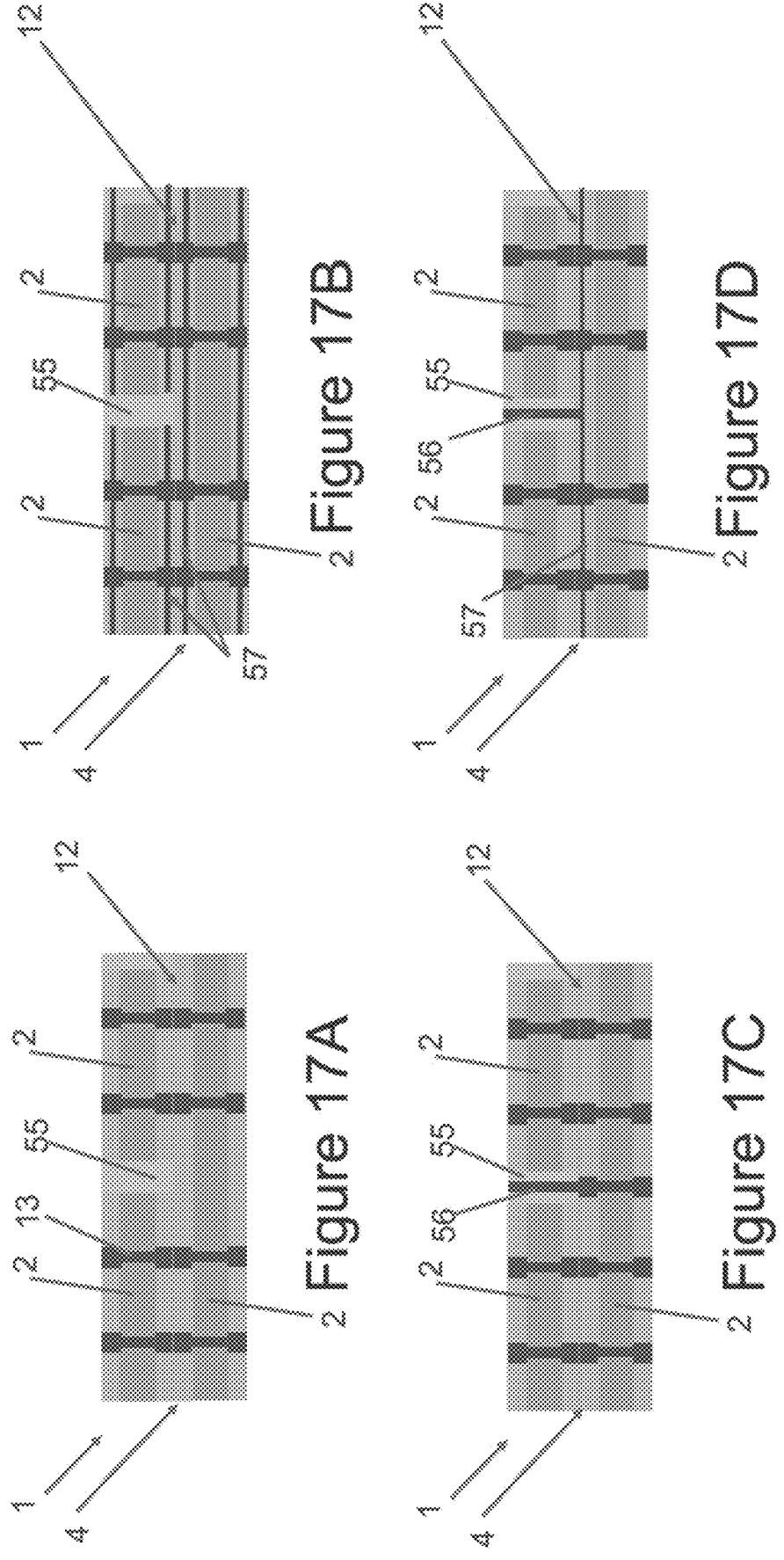
FIGS. 17A-17D illustrates additional bonded structures that can be provided with the methods disclosed herein.

FIGS. 17A-17D illustrates additional bonded structures 1 that can be provided with the methods disclosed herein. In FIG. 17A, the bonded structure 1 can include a plurality of elements 2, which can include combinations of integrated device dies and interposers. Thus, the methods disclosed herein can be used for active and/or inactive devices. Moreover, as shown in FIG. 17A, an insulating column 55 can be provided to separate the adjacent elements 2 in the upper reconstituted element. In FIG. 17B, the bonded structure 1 can include one or more redistribution layers (RDLs) 57 which can include lateral conductive routing traces to carry signals laterally inward or outward. The RDLs 57 can enable fan-in or fan-out arrangements for connecting to an external package substrate. In FIG. 17C, a conductive via 56 can be provided in the insulating column 56 to carry signals from the lower element 2 to the upper surface of the bonded structure 1. In FIG. 17D, the bonded structure 1 can include both the via 56 in the insulating column 56 and the RDL(s) 57. Skilled artisans will understand that additional combinations may be suitable.

Figure 18:
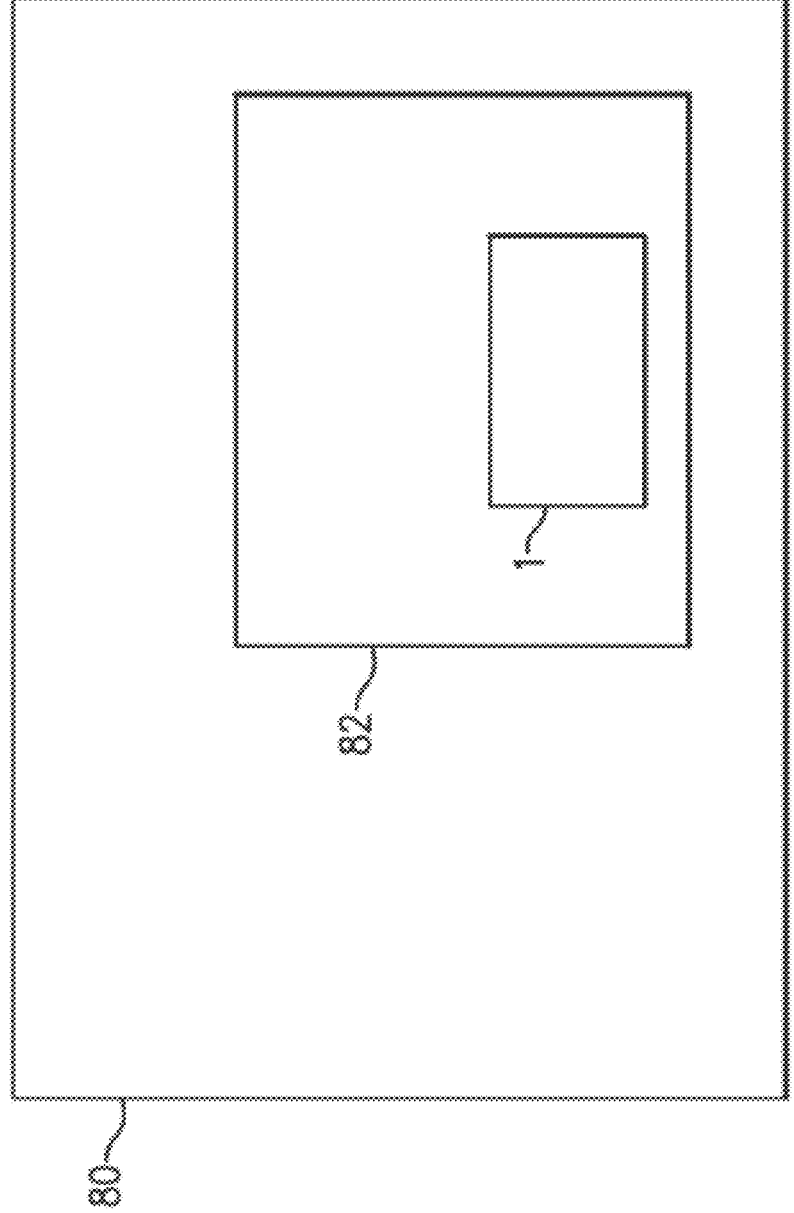
FIG. 18 is a schematic diagram of a system incorporating one or more bonded structures, according to various embodiments.

FIG. 18 is a schematic diagram of a system 80 incorporating one or more bonded structures 1, according to various embodiments. The system 80 can comprise any suitable type of electronic device, such as a mobile electronic device (e.g., a smartphone, a tablet computing device, a laptop computer, etc.), a desktop computer, an automobile or components thereof, a stereo system, a medical device, a camera, or any other suitable type of system. In some embodiments, the electronic device can comprise a microprocessor, a graphics processor, an electronic recording device, or digital memory. The system 80 can include one or more device packages 82 which are mechanically and electrically connected to the system 80, e.g., by way of one or more motherboards. Each package 82 can comprise one or more bonded structures 1. The bonded structures 1 shown in FIG. 18 can comprise any of the bonded structures 1 shown and described above in connection with FIGS. 1A-17. The bonded structure 1 can include one or more integrated device dies which perform various functions for the system 80.

In one embodiment, a bonded structure is disclosed. The bonded structure can include a first reconstituted element comprising a first element and having a first side comprising a first bonding surface and a second side opposite the first side. The first reconstituted element can comprise a first protective material disposed about a first sidewall surface of the first element. The bonded structure can comprise a second reconstituted element comprising a second element and having a first side comprising a second bonding surface and a second side opposite the first side. The first reconstituted element can comprise a second protective material disposed about a second sidewall surface of the second element. The second bonding surface of the first side of the second reconstituted element can be directly bonded to the first bonding surface of the first side of the first reconstituted element without an intervening adhesive along a bonding interface. The first protective material can be flush with the first bonding surface and the second protective material can be flush with the second bonding surface.

In another embodiment, a bonded structure is disclosed. The bonded structure can include a first reconstituted element comprising a first element and having a first side and a second side opposite the first side. The bonded structure can include a second reconstituted element comprising a second element and having a first side and a second side opposite the first side, the first side of the second reconstituted element directly bonded to the first side of the first reconstituted element without an intervening adhesive along a bonding interface. The bonded structure can include a protective material disposed about respective first and second side surfaces of the first and second elements. The bonded structure can include a nonconductive layer disposed between the first and second elements, the nonconductive layer flush with at least one of the first and second side surfaces of the first and second elements such that an interface is provided between the protective material and the nonconductive layer.

In another embodiment, a bonded structure is disclosed. The bonded structure can include a first reconstituted wafer comprising a plurality of first elements. The bonded structure can comprise a second reconstituted wafer comprising a plurality of second elements. The first and second reconstituted wafers can be directly bonded to one another without an adhesive.

In another embodiment, a bonding method is disclosed. The bonding method can include applying a first protective material over a plurality of first elements to form a first reconstituted wafer. The bonding method can include applying a second protective material over a plurality of second elements to form a second reconstituted wafer. The bonding method can include directly bonding the first reconstituted wafer to the second reconstituted wafer without an adhesive.

In another embodiment, a bonding method is disclosed. The bonding method can include directly bonding a first element to a carrier without an adhesive. The carrier can comprise a silicon carrier with a silicon oxide layer disposed directly onto a surface of the silicon carrier. The silicon oxide layer can be directly bonded to the first element. The silicon oxide layer can comprise a native oxide layer or a thermal oxide layer.

All of these embodiments are intended to be within the scope of this disclosure. These and other embodiments will become readily apparent to those skilled in the art from the following detailed description of the embodiments having reference to the attached figures, the claims not being limited to any particular embodiment(s) disclosed. Although this certain embodiments and examples have been disclosed herein, it will be understood by those skilled in the art that the disclosed implementations extend beyond the specifically disclosed embodiments to other alternative embodiments and/or uses and obvious modifications and equivalents thereof. In addition, while several variations have been shown and described in detail, other modifications will be readily apparent to those of skill in the art based upon this disclosure. It is also contemplated that various combinations or sub-combinations of the specific features and aspects of the embodiments may be made and still fall within the scope. It should be understood that various features and aspects of the disclosed embodiments can be combined with, or substituted for, one another in order to form varying modes of the disclosed implementations. Thus, it is intended that the scope of the subject matter herein disclosed should not be limited by the particular disclosed embodiments described above, but should be determined only by a fair reading of the claims that follow.

What is claimed is:

1. A method comprising:
providing a carrier wafer having an upper surface;
directly bonding lower surfaces of a plurality of elements to the upper surface of the carrier wafer without an intervening adhesive, each of the plurality of elements further comprising side surfaces;
applying an inorganic material along the side surfaces of the plurality of elements and over the upper surface of the carrier wafer to form a reconstituted wafer;
forming a bonding surface at an upper surface of the reconstituted wafer, wherein the bonding surface comprises a first nonconductive region and a first conductive region; and
directly bonding a second wafer to the reconstituted wafer such that a second nonconductive region on the second wafer is directly bonded to the first nonconductive region of the reconstituted wafer and a second conductive region on the second wafer is directly bonded to the first conductive region of the reconstituted wafer.

2. The method of claim 1, further comprising, after directly bonding, removing the carrier wafer.

3. The method of claim 1, wherein the inorganic material comprises silicon oxide.

4. The method of claim 1, wherein the inorganic material comprises silicon nitride.

5. The method of claim 1, wherein applying the inorganic material comprises multiple layers.

6. The method of claim 1, wherein applying the inorganic material comprises providing a conformal layer over upper surfaces of the plurality of elements and the side surfaces of the plurality of elements.

7. The method of claim 6, further comprising applying a filling layer in at least one gap between at least two adjacent elements of the plurality of elements.

8. The method of claim 7, wherein the filling layer comprises a second inorganic material.

9. The method of claim 1, further comprising thinning the plurality of elements while the plurality of elements are directly bonded to the carrier wafer.

10. The method of claim 9, further comprising, after thinning, etching the plurality of elements from a side of the plurality of elements opposite the carrier wafer.

11. The method of claim 10, wherein etching is performed before applying the inorganic material.

12. The method of claim 1, further comprising singulating the plurality of elements from a host wafer before directly bonding the lower surfaces of the plurality of elements to the upper surface of the carrier wafer.

13. The method of claim 1, further comprising singulating the directly bonded second and reconstituted wafers to form a plurality of bonded structures.

14. The method of claim 1, wherein the plurality of elements comprises a plurality of singulated dies.

15. The method of claim 1, wherein the plurality of elements comprises a plurality of optical elements.

16. A method comprising:
providing a plurality of optical elements on an upper surface of a carrier;
applying an insulating conformal layer along at least side surfaces of each of the plurality of optical elements;

applying an insulating filler layer in at least one gap between at least two adjacent optical elements of the plurality of optical elements to form a reconstituted wafer; and
directly bonding the reconstituted wafer to a substrate such that a first nonconductive region of the reconstituted wafer is directly bonded to a second nonconductive region of the substrate and a first conductive region of the reconstituted wafer is directly bonded to a second conductive region of the substrate.

17. The method of claim 16, wherein the insulating conformal layer comprises a first inorganic material and the insulating filler layer comprises a second inorganic material.

18. The method of claim 17, wherein the insulating conformal layer comprises multiple inorganic layers.

19. The method of claim 17, wherein the first inorganic material comprises silicon nitride.

20. The method of claim 17, wherein the first inorganic material comprises silicon oxide.

21. The method of claim 20, wherein the second inorganic material comprises silicon oxide.

22. The method of claim 16, further comprising, after directly bonding, removing the carrier.

23. The method of claim 16, further comprising etching the plurality of optical elements from a side of the plurality of optical elements opposite the carrier.

24. The method of claim 23, wherein etching is performed before applying the first insulating conformal layer.

25. The method of claim 16, wherein providing the plurality of optical elements on the upper surface of the carrier comprises directly bonding the plurality of optical elements to the upper surface of the carrier.

26. The method of claim 25, further comprising singulating the plurality of optical elements from a host wafer before directly bonding the plurality of optical elements to the upper surface of the carrier.

27. The method of claim 16, further comprising singulating the directly bonded substrate and the reconstituted wafer to form a plurality of bonded structures.

28. The method of claim 16, wherein applying the insulating conformal layer along the at least side surfaces of each of the plurality of optical elements comprises applying the insulating conformal layer directly over the at least side surfaces.

29. The method of claim 16, wherein applying the insulating conformal layer comprises applying the insulating conformal layer over the upper surface of the carrier.

30. A bonding method comprising:
providing a first reconstituted element comprising a plurality of first singulated elements;
providing a second reconstituted element comprising a plurality of second singulated elements; and
directly bonding the first and second reconstituted elements to each other without an adhesive.

31. The bonding method of claim 30, wherein directly bonding the first and second reconstituted elements to each other comprises hybrid bonding the first and second reconstituted elements to each other.

32. The bonding method of claim 30, further comprising singulating the directly bonded first and second reconstituted elements.

33. The bonding method of claim 30, wherein the plurality of first singulated elements comprises at least one dummy element.

34. The bonding method of claim 30, wherein providing the first reconstituted element comprises at least partially embedding at least one of the plurality of first singulated elements in a protective material.

35. The bonding method of claim 34, wherein providing the second reconstituted element comprises at least partially embedding at least one of the plurality of second singulated elements in a protective material.

36. The bonding method of claim 34, wherein the protective material comprises an organic material.

37. The bonding method of claim 34, wherein the protective material comprises an inorganic material.

38. The bonding method of claim 37, wherein the protective material comprises multiple layers.

* * * * *